United States Patent
Terasaki et al.

(10) Patent No.: US 10,513,774 B2
(45) Date of Patent: Dec. 24, 2019

(54) SUBSTRATE PROCESSING APPARATUS AND GUIDE PORTION

(71) Applicant: HITACHI KOKUSAI ELECTRIC INC., Tokyo (JP)

(72) Inventors: Masato Terasaki, Toyama (JP); Naonori Akae, Toyama (JP); Hideki Horita, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 495 days.

(21) Appl. No.: 15/191,151

(22) Filed: Jun. 23, 2016

(65) Prior Publication Data

US 2016/0298235 A1 Oct. 13, 2016

Related U.S. Application Data

(62) Division of application No. 14/223,132, filed on Mar. 24, 2014, now Pat. No. 9,401,272.

(30) Foreign Application Priority Data

Mar. 25, 2013 (KR) ................ 2013-061907
Feb. 28, 2014 (KR) ................ 2014-039468

(51) Int. Cl.
*C23C 16/44* (2006.01)
*H01L 21/02* (2006.01)
(Continued)

(52) U.S. Cl.
CPC .... *C23C 16/4405* (2013.01); *C23C 16/45523* (2013.01); *C23C 16/45525* (2013.01);
(Continued)

(58) Field of Classification Search
CPC .............................. C23C 16/45512
See application file for complete search history.

(56) References Cited

U.S. PATENT DOCUMENTS 7,828,898 B2 * 11/2010 Maeda ............ C23C 16/45512
118/715
9,685,317 B2 * 6/2017 Yuasa ............ H01L 21/02104
(Continued)

FOREIGN PATENT DOCUMENTS

JP  2000-021795 A  1/2000
JP  2000-173928 A  6/2000
(Continued)

OTHER PUBLICATIONS

Japanese Office Action, JP Patent Application No. 2014-039468, dated Nov. 17, 2017, 4 pages. (English translation attached).

*Primary Examiner* — Robert M Kunemund
(74) *Attorney, Agent, or Firm* — Volpe and Koenig, P.C.

(57) ABSTRACT

A cleaning method includes (a) providing a process chamber after forming an oxide film on a substrate in the process chamber formed by a reaction tube and a manifold supporting the reaction tube by performing a cycle a predetermined number of times, the cycle including supplying a source gas to the substrate through a first nozzle in the manifold extending upward to an inside of the reaction tube, and supplying an oxidizing gas to the substrate through a second nozzle in the manifold extending upward to the inside of the reaction tube; and (b) cleaning an inside of the process chamber. The step (b) includes a first cleaning process of supplying a hydrogen fluoride gas into the reaction tube through the second nozzle; and a second cleaning process of supplying a hydrogen fluoride gas onto an inner wall surface of the manifold through a third nozzle disposed in the manifold.

11 Claims, 16 Drawing Sheets

(51) Int. Cl.
- *C23C 16/455* (2006.01)
- *B08B 3/00* (2006.01)
- *B08B 3/04* (2006.01)
- *B08B 3/02* (2006.01)
- *B08B 5/00* (2006.01)
- *B08B 5/02* (2006.01)
- *B08B 9/02* (2006.01)
- *B08B 9/00* (2006.01)
- *B08B 9/023* (2006.01)
- *B08B 9/027* (2006.01)
- *B08B 9/04* (2006.01)
- *H01J 37/32* (2006.01)
- *B08B 7/00* (2006.01)

(52) U.S. Cl.
CPC .... *C23C 16/45561* (2013.01); *H01L 21/0228* (2013.01); *H01L 21/02164* (2013.01); *H01L 21/02211* (2013.01); *B08B 3/00* (2013.01); *B08B 3/02* (2013.01); *B08B 3/04* (2013.01); *B08B 5/00* (2013.01); *B08B 5/02* (2013.01); *B08B 7/00* (2013.01); *B08B 9/00* (2013.01); *B08B 9/02* (2013.01); *B08B 9/023* (2013.01); *B08B 9/027* (2013.01); *B08B 9/04* (2013.01); *H01J 37/32862* (2013.01); *H01L 21/02049* (2013.01)

(56) References Cited

U.S. PATENT DOCUMENTS

| | | |
|---|---|---|
| 2005/0211264 A1* | 9/2005 | Kostenko ............ B08B 7/0035 134/1.1 |
| 2009/0071505 A1 | 3/2009 | Miya et al. |
| 2009/0305517 A1 | 12/2009 | Nakashime et al. |
| 2010/0167541 A1 | 7/2010 | Kato |
| 2011/0201210 A1 | 8/2011 | Sato et al. |
| 2013/0084712 A1 | 4/2013 | Yuasa et al. |
| 2013/0149873 A1 | 6/2013 | Hirose et al. |
| 2013/0164943 A1 | 6/2013 | Koshi et al. |
| 2013/0252434 A1 | 9/2013 | Yuasa et al. |
| 2013/0260566 A1 | 10/2013 | Yamazaki |
| 2014/0087568 A1 | 3/2014 | Noda et al. |
| 2014/0248783 A1 | 9/2014 | Kameda et al. |

FOREIGN PATENT DOCUMENTS

| | | |
|---|---|---|
| JP | 2010-171389 A | 8/2010 |
| JP | 2011-187934 A | 9/2011 |
| KR | 10-2011-0094245 A | 8/2011 |
| WO | 2007-116768 A1 | 10/2007 |

* cited by examiner

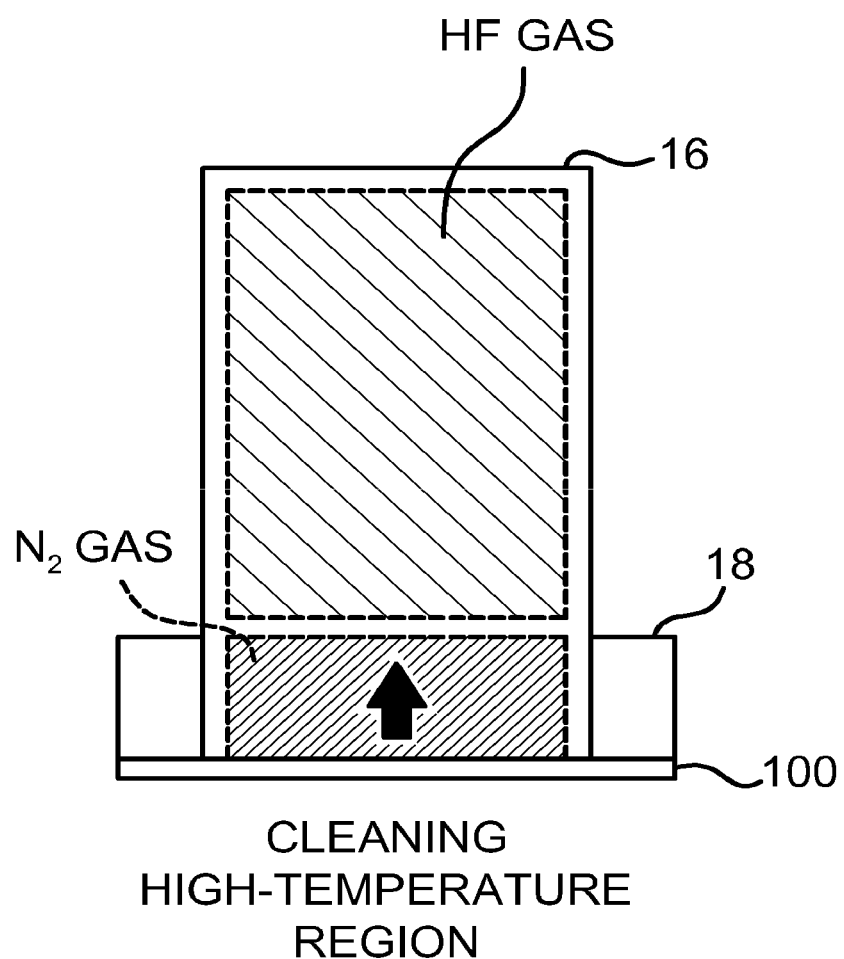

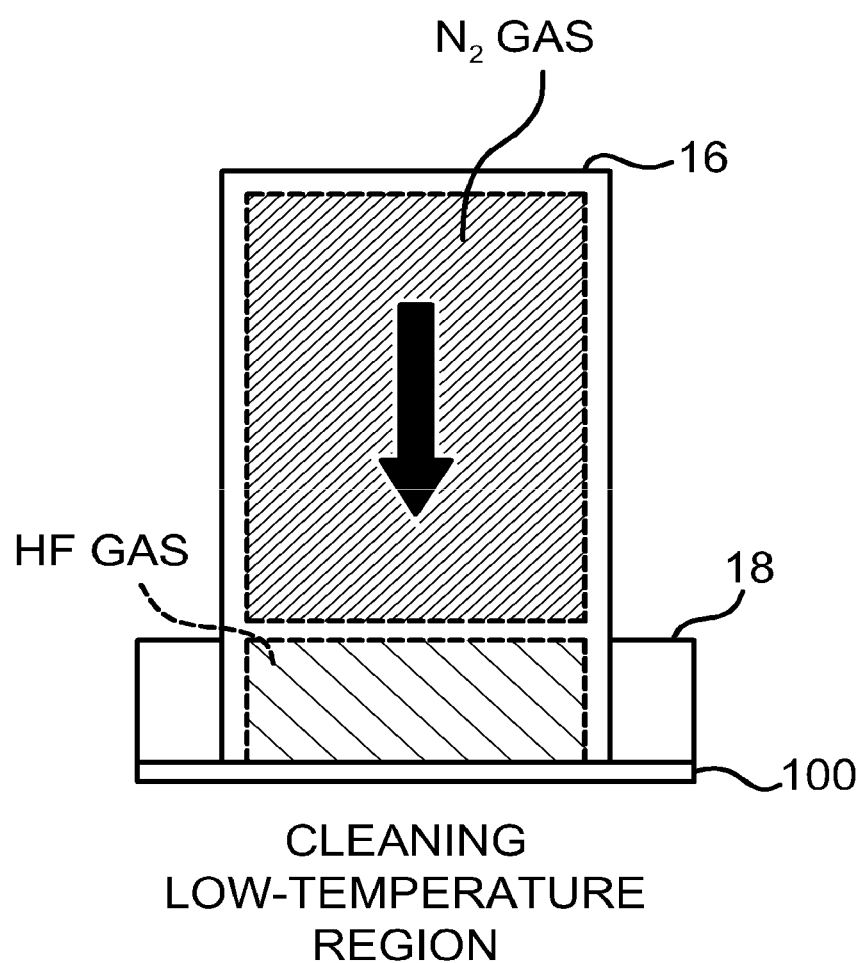

SUBSTRATE PROCESSING APPARATUS AND GUIDE PORTION

CROSS-REFERENCE TO RELATED PATENT APPLICATION

This U.S. non-provisional patent application and is a division of U.S. patent application Ser. No. 14/223,132 filed on Mar. 24, 2014 now U.S. Pat. No. 9,401,272, and claims priority under 35 U.S.C. § 119 of Japanese Patent Applications No. 2013-061907 and No. 2014-039468 filed on Mar. 25, 2013 and Feb. 28, 2014, respectively, in the Japanese Patent Office, the entire contents of which are hereby incorporated by reference.

BACKGROUND OF THE INVENTION

1. Field of the Invention

The present invention relates to a cleaning method, a method of manufacturing a semiconductor device, a substrate processing apparatus and a non-transitory computer-readable recording medium.

2. Description of the Related Art

As a method of cleaning an inside of a process chamber of a substrate processing apparatus, there is a cleaning method performed by supplying a cleaning gas into a process chamber through a nozzle configured to supply a processing gas for processing a substrate.

SUMMARY OF THE INVENTION

However, since a nozzle configured to supply a processing gas is often disposed so as to supply a gas toward a substrate, it is difficult to clean other portions, for example, the vicinity of an opening for unloading and unloading the substrate. Reaction by-products are likely to remain in the portions in which cleaning is difficult. In order to remove the reaction by-products, a cleaning gas needs to be supplied for a long time or further cleaning needs to be performed manually by wiping and the like when cleaning using a gas is not sufficient. Thereby, there is a problem in that a time required for cleaning increases.

An object of the present invention is to provide technology capable of reducing a time required for cleaning.

According to an aspect of the present invention, there is provided a cleaning method, including:

(a) providing a process chamber after forming an oxide film on a substrate in the process chamber formed by a reaction tube and a manifold supporting the reaction tube by performing a cycle a predetermined number of times, the cycle including supplying a source gas to the substrate in the process chamber through a first nozzle disposed in the manifold and extending upward from an inside of the reaction tube, and supplying an oxidizing gas to the substrate in the process chamber through a second nozzle disposed in the manifold and extending upward from the manifold to the inside of the reaction tube; and (b) cleaning an inside of the process chamber,
wherein the step (b) includes:
a first cleaning process of supplying a hydrogen fluoride gas into the reaction tube through the second nozzle; and
a second cleaning process of supplying a hydrogen fluoride gas onto an inner wall surface of the manifold through a third nozzle disposed in the manifold.

According to another aspect of the present invention, there is provided a method of manufacturing a semiconductor device, including:

(a) forming an oxide film on a substrate in the process chamber formed by a reaction tube and a manifold supporting the reaction tube by performing a cycle a predetermined number of times, the cycle including supplying a source gas to the substrate in the process chamber through a first nozzle disposed in the manifold and extending upward from the manifold to an inside of the reaction tube, and supplying an oxidizing gas to the substrate in the process chamber through a second nozzle disposed in the manifold and extending upward from the manifold to the inside of the reaction tube; and (b) cleaning an inside of the process chamber after the step (a) is performed,
wherein the step (b) includes:
a first cleaning process of supplying a hydrogen fluoride gas into the reaction tube through the second nozzle; and
a second cleaning process of supplying a hydrogen fluoride gas onto an inner wall surface of the manifold through a third nozzle disposed in the manifold.

According to still another aspect of the present invention, there is provided a substrate processing apparatus, including:

a process chamber formed by a reaction tube and a manifold supporting the reaction tube;
a source gas supply system configured to supply a source gas into the process chamber;
an oxidizing gas supply system configured to supply an oxidizing gas into the process chamber;
a hydrogen fluoride gas supply system configured to supply a hydrogen fluoride gas into the process chamber;
a first nozzle disposed in the manifold and extending upward from the manifold to an inside of the reaction tube;
a second nozzle disposed in the manifold and extending upward from the manifold to the inside of the reaction tube;
a third nozzle disposed in the manifold; and
a control unit configured to control the source gas supply system, the oxidizing gas supply system and the hydrogen fluoride gas supply system to perform: (a) forming an oxide film on a substrate in the process chamber by performing a cycle a predetermined number of times, the cycle including supplying the source gas to the substrate in the process chamber through the first nozzle and supplying the oxidizing gas to the substrate in the process chamber through the second nozzle; and (b) cleaning an inside of the process chamber after performing the step (a), wherein the step (b) includes a first cleaning process of supplying the hydrogen fluoride gas into the reaction tube through the second nozzle and a second cleaning process of supplying the hydrogen fluoride gas onto an inner wall surface of the manifold through the third nozzle.

According to yet another aspect of the present invention, there is provided a non-transitory computer-readable recording medium storing a program causing a computer to execute:

(a) forming an oxide film on a substrate in the process chamber formed by a reaction tube and a manifold supporting the reaction tube by performing a cycle a predetermined number of times, the cycle including supplying a source gas to the substrate in the process chamber through a first nozzle disposed in the manifold and extending upward from the manifold to an inside of the reaction tube, and supplying an oxidizing gas to the substrate in the process chamber through a second nozzle disposed in the manifold and extending upward from the manifold to the inside of the reaction tube; and (b) cleaning an inside of the process chamber after the step (a) is performed, wherein the step (b) includes:

a first cleaning process of supplying a hydrogen fluoride gas into the reaction tube through the second nozzle; and a second cleaning process of supplying a hydrogen fluoride gas onto an inner wall surface of the manifold through a third nozzle disposed in the manifold.

BRIEF DESCRIPTION OF THE DRAWINGS

FIGS. 8*a* and 8*b* are diagrams illustrating a cleaning method according to a temperature range in the vertical processing furnace of the substrate processing apparatus preferably used in the embodiment of the present invention.

DETAILED DESCRIPTION OF THE PREFERRED EMBODIMENTS

First Embodiment

Figure 1:
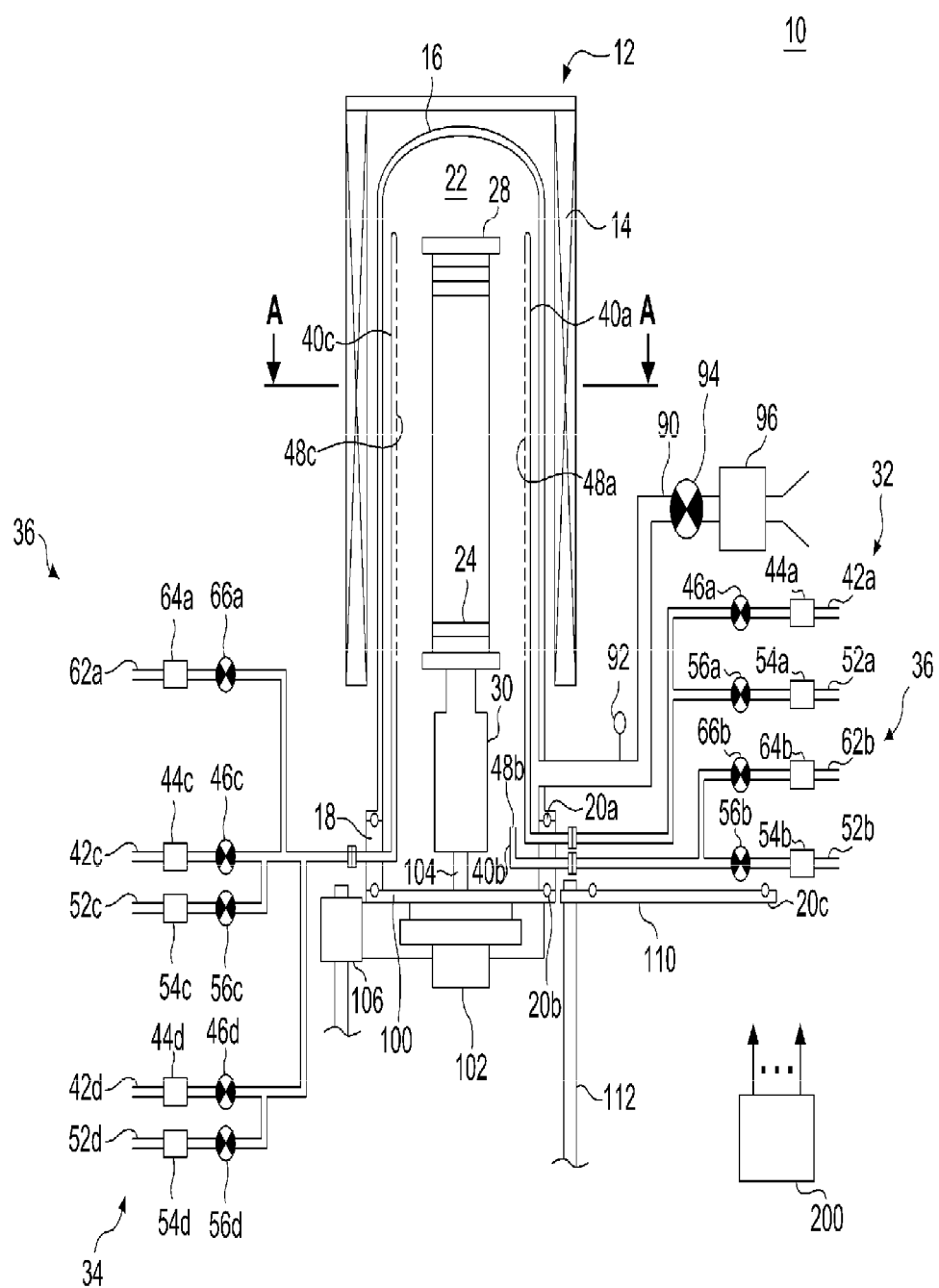
FIG. 1 is a schematic configuration diagram illustrating a vertical processing furnace of a substrate processing apparatus preferably used in an embodiment of the present invention and is a vertical cross-sectional view illustrating a processing furnace part.
Figure 2:
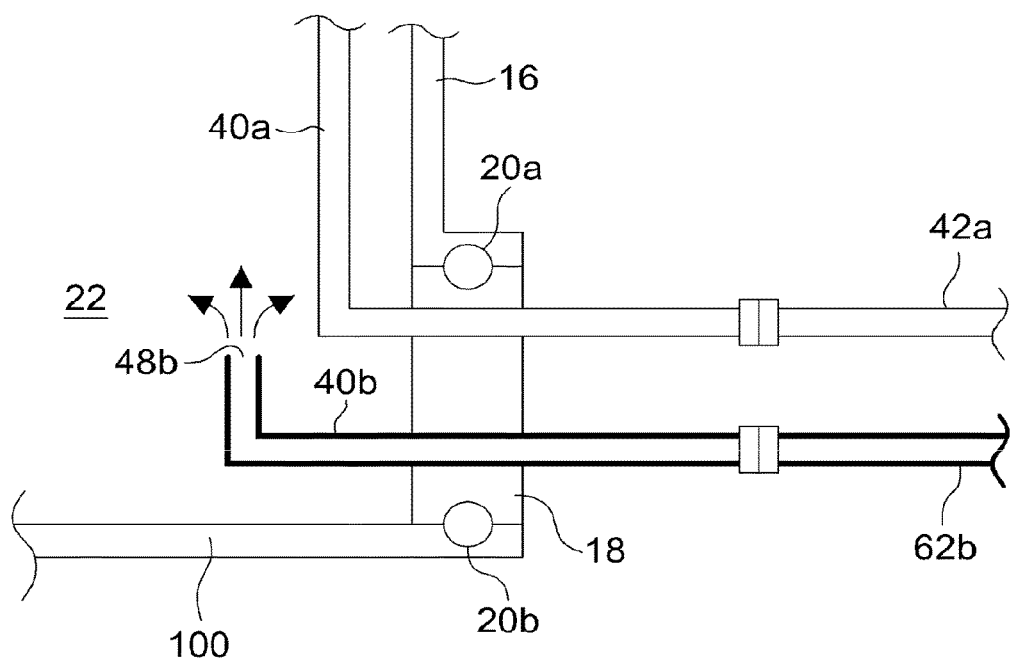
FIG. 2 is an enlarged partial cross-sectional view illustrating a periphery of a nozzle 40*b* in a first embodiment of the vertical processing furnace of the substrate processing apparatus preferably used in the embodiment of the present invention.

The first embodiment of the present invention will be described.

(1) Configuration of Substrate Processing Apparatus

A processing furnace 12 includes a heater 14 serving as a heating unit (heating mechanism). The heater 14 has a cylindrical shape and is vertically installed by being supported by a heater base (not illustrated) serving as a holding plate. The heater 14 also functions as an activating mechanism (excitation unit) for activating a gas by heat.

In the heater 14, a reaction tube 16 is concentrically provided with respect to the heater 14. The reaction tube 16 is formed to have a cylindrical shape whose upper end is blocked and lower end is opened. The reaction tube 16 is made of a heat-resistant material such as quartz ($SiO_2$) and silicon carbide (SiC).

A manifold 18 (inlet flange) is concentrically provided with respect to the reaction tube 16 below the reaction tube 16. The manifold 18 is formed to have a cylindrical shape whose upper end and lower end are opened and is made of a metal such as stainless. An upper end of the manifold 18 is engaged with a lower end of the reaction tube 16 and is configured to support the reaction tube 16.

An O ring 20*a* is provided as a seal member between the manifold 18 and the reaction tube 16. The manifold 18 is supported by the heater base, and thereby the reaction tube 16 is in a vertically installed state.

A process container (reaction container) mainly includes the reaction tube 16 and the manifold 18. A process chamber 22 is formed in a cylindrical hollow portion of the process container. An opening for loading and unloading a wafer 24 as a substrate is formed below the process chamber 22. The process chamber 22 uses a boat 28 as a substrate holder for holding the wafer 24 to accommodate the wafer 24 in a vertical arrangement of multiple stages in a horizontal posture.

The boat 28 holds a plurality of wafers 24 in multiple stages in vertical and central alignment. The boat 28 is made of a heat-resistant material such as quartz and SiC. An insulation member 30 made of a heat-resistant material such as quartz and SiC is provided in a bottom of the boat 28 and is configured such that heat from the heater 14 is not easily delivered to a lower part. The insulation member 30 may include a plurality of heat insulating plates made of a heat-resistant material such as quartz and SiC and a heat insulating plate holder for horizontally supporting these heat insulating plates in multiple stages.

The processing furnace 12 includes a first gas supply system 32 configured to supply a first gas (for example, a source gas) for processing the wafer 24 into the process chamber 22, a second gas supply system 34 configured to supply a second gas (for example, a reaction gas) for processing the wafer 24 into the process chamber 22, and a third gas supply system 36 configured to supply a third gas (a cleaning gas) for cleaning an inside of the process chamber 22.

The processing furnace 12 includes three nozzles 40a, 40b, and 40c for introducing gases into the process chamber 22. These nozzles 40a, 40b, and 40c are provided so as to penetrate a sidewall of the manifold 18. The nozzles 40a, 40b, and 40c are made of a heat-resistant material such as quartz and SiC. A gas supply pipe 42a and an inert gas supply pipe 52a are connected to the nozzle 40a. A cleaning gas supply pipe 62b and an inert gas supply pipe 52b are connected to the nozzle 40b. A gas supply pipe 42c, an inert gas supply pipe 52c, a cleaning gas supply pipe 62a, a gas supply pipe 42d, and an inert gas supply pipe 52d are connected to the nozzle 40c.

In this manner, the processing furnace 12 includes the three nozzles [the nozzles 40a, 40b, and 40c], the three gas supply pipes [the gas supply pipes 42a, 42c, and 42d], the four inert gas supply pipes [the inert gas supply pipes 52a, 52b, 52c, and 52d], and the two cleaning gas supply pipes [the cleaning gas supply pipes 62a and 62b]. A plurality of types of gases are supplied into the process chamber 22.

(Source Gas Supply System: First Gas Supply System)

In the gas supply pipe 42a, when a side of the process chamber 22 is set as a downstream side, in order from an upstream end, a mass flow controller (MFC) 44a serving as a flow rate controller (flow rate control unit) and a valve 46a serving as an on-off valve are provided, and the inert gas supply pipe 52a is connected to a downstream side of the valve 46a. The nozzle 40a is connected to a front end of the gas supply pipe 42a. In order from an upstream end, an MFC 54a and a valve 56a are provided in the inert gas supply pipe 52a.

The nozzle 40a is provided in a toric space between an inner wall of the reaction tube 16 and the wafer 24 accommodated in the process chamber 22, and is provided so as to extend upward in a stacking direction of the wafer 24 from the manifold 18 to an inside of the reaction tube 16. The nozzle 40a is provided so as to follow a region that is a side of a wafer arrangement region in which the wafer 24 is arranged and that horizontally surrounds the wafer arrangement region. The nozzle 40a is configured as an L-shaped long nozzle. The nozzle 40a is provided such that a horizontal portion thereof penetrates a sidewall of the manifold 18 and a vertical portion thereof extends upward from at least one end side of the wafer arrangement region toward the other end side A gas supply hole 48a configured to supply a gas is provided in a side surface of the nozzle 40a. The gas supply hole 48a faces a center of the reaction tube 16 and is configured to supply a gas toward the wafer 24 accommodated in the process chamber 22. A plurality of gas supply holes 48a are provided from a bottom to a top of the reaction tube 16 at the same pitch, and each have the same opening area.

The first gas supply system 32 mainly includes the gas supply pipe 42a, the MFC 44a, and the valve 46a. The nozzle 40a also functions as a part of the first gas supply system 32. Also, an inert gas supply system mainly includes the inert gas supply pipe 52a, the MFC 54a, and the valve 56a. The inert gas supply system also functions as a purge gas supply system.

A source gas containing a predetermined element and a halogen element is supplied from the gas supply pipe 42a. As a source gas (a gas containing Si and Cl) which contains silicon (Si) as the predetermined element and chlorine (Cl) as the halogen element, for example, a hexachlorodisilane ($Si_2Cl_6$, abbreviated to HCDS) gas, which is a kind of chlorosilane-based source gas, is supplied from the gas supply pipe 42a into the process chamber 22 through the MFC 44a, the valve 46a, and the nozzle 40a. At this time, an inert gas may also be supplied from the inert gas supply pipe 52a into the gas supply pipe 42a through the MFC 54a and the valve 56a.

In the present embodiment, the first gas supply system 32 functions as a source gas supply system.

The chlorosilane-based source gas refers to a chlorosilane-based material in a gas state, for example, a gas obtained by vaporizing a chlorosilane-based material that is in a liquid state under normal temperature and normal pressure, or a chlorosilane-based material that is in a gas state under normal temperature and normal pressure. In addition, the chlorosilane-based material refers to a silane-based material having a chloro group as a halogen group and refers to a source containing at least Si and Cl. The chlorosilane-based material referred to herein may be a kind of halide.

In this specification, the term "source" may refer to either or both of "a liquid source in a liquid state" and "a source gas in a gas state." In this specification, the term "chlorosilane-based material" may refer to either or both of "a chlorosilane-based material in a liquid state" and "a chlorosilane-based source gas in a gas state." When a liquid source that is in a liquid state under normal temperature and normal pressure such as HCDS is used, the liquid source is vaporized by a vaporization system such as a vaporizer and a bubbler and is supplied as a source gas (HCDS gas).

(Reaction Gas Supply System: Second Gas Supply System)

In the gas supply pipe 42c, in order from an upstream end, an MFC 44c and a valve 46c are provided, and the inert gas supply pipe 52c is connected downstream from the valve 46c. In the inert gas supply pipe 52c, in order from an upstream end, an MFC 54c and a valve 56c are provided. The nozzle 40c is connected to a front end of the gas supply pipe 42c.

The nozzle 40c is provided so as to extend upward in a stacking direction of the wafer 24 from a bottom to a top of the inner wall of the reaction tube 16. The nozzle 40c is provided so as to follow a region that is a side of a wafer arrangement region in which the wafer 24 is arranged and that horizontally surrounds the wafer arrangement region. The nozzle 40c is configured as an L-shaped long nozzle. The nozzle 40c is provided such that a horizontal portion thereof penetrates a sidewall of the manifold 18 and a vertical portion thereof extends upward from at least one end side of the wafer arrangement region toward the other end side.

A gas supply hole 48c configured to supply a gas is provided in a side surface of the nozzle 40c. The gas supply hole 48c faces a center of the reaction tube 16 and is configured to supply a gas toward the wafer 24 accommodated in the process chamber 22.

A plurality of gas supply holes 48c are provided from a bottom to a top of the reaction tube 16.

The gas supply pipe 42d is connected downstream from the valve 46c of the gas supply pipe 42c and the valve 56c of the inert gas supply pipe 52c. In the gas supply pipe 42d, in order from an upstream end, an MFC 44d and a valve 46d are provided, and the inert gas supply pipe 52d is connected downstream from the valve 46d. In the inert gas supply pipe 52d, in order from an upstream end, an MFC 54d and a valve 56d are provided.

The second gas supply system 34 mainly includes the nozzle 40c, the gas supply pipes 42c and 42d, the MFCs 44c and 44d, and the valves 46c and 46d. The inert gas supply system mainly includes the inert gas supply pipes 52c and 52d, the MFCs 54c and 54d, and the valves 56c and 56d. The inert gas supply system also functions as a purge gas supply system.

A gas (oxygen-containing gas) which contains oxygen, that is an oxidizing gas (oxidation gas), is supplied from the gas supply pipe 42c as a reaction gas. As an oxygen-containing gas, for example, oxygen ($O_2$) gas is supplied into the process chamber 22 through the MFC 44c, the valve 46c, the gas supply pipe 42c, and the nozzle 40c. At this time, the inert gas may also be supplied from the inert gas supply pipe 52c into the gas supply pipe 42c through the MFC 54c and the valve 56c.

A gas (hydrogen-containing gas) which contains hydrogen, that is a reducing gas (reduction gas), is supplied from the gas supply pipe 42d as a reaction gas. As a hydrogen-containing gas, for example, hydrogen ($H_2$) gas is supplied into the process chamber 22 through the MFC 44d, the valve 46d, the gas supply pipe 42d, and the nozzle 40c. At this time, an inert gas may also be supplied from the inert gas supply pipe 52d into the gas supply pipe 42d through the MFC 54d and the valve 56d.

In the present embodiment, the second gas supply system 34 functions as a reaction gas supply system.

(Cleaning Gas Supply System: Third Gas Supply System)

The cleaning gas supply pipe 62a is connected to the gas supply pipe 42c. In the cleaning gas supply pipe 62a, in order from an upstream end, an MFC 64a and a valve 66a are provided. The nozzle 40c is connected to a front end of the cleaning gas supply pipe 62a through the gas supply pipe 42c. In the cleaning gas supply pipe 62b, in order from an upstream end, an MFC 64b and a valve 66b are provided, and the inert gas supply pipe 52b is connected downstream from the valve 66b. In the inert gas supply pipe 52b, in order from an upstream end, an MFC 54b and a valve 56b are provided. The nozzle 40b is connected to a front end of the cleaning gas supply pipe 62b. The nozzle 40b is disposed so as to face an exhaust pipe 90 (described later) with the boat 28 accommodated in a process chamber 20, that is, the wafer 24, interposed therebetween as seen in a plan view (refer to FIG. 3). Also, in FIG. 1, positions of the nozzles 40a, 40b, and 40c, the exhaust pipe 90, and the like are conveniently shown for illustration.

The nozzle 40b is configured as an L-shaped short nozzle. The nozzle 40b is provided such that a horizontal portion thereof penetrates a sidewall of the manifold 18 and a vertical portion thereof extends upward along an inner wall of the manifold 18.

A gas supply hole 48b configured to supply a gas is provided in a leading end of the nozzle 40b, and the gas supply hole 48b is opened upward [opened in a direction from the manifold 18 side toward the reaction tube 16 side]. The nozzle 40b is configured to supply a gas to the manifold 18 side relative to a position in which the nozzle 40a supplies a gas. In addition, the nozzle 40b is able to supply a gas toward an inner wall surface of the manifold 18.

A first cleaning gas supply system mainly includes the nozzle 40c, the cleaning gas supply pipe 62a, the MFC 64a, and the valve 66a. In addition, a second cleaning gas supply system mainly includes the nozzle 40b, the cleaning gas supply pipe 62b, the MFC 64b, and the valve 66b. Also, the inert gas supply system includes the inert gas supply pipe 52b, the MFC 54b, and the valve 56b. The inert gas supply system also functions as a purge gas supply system. The third gas supply system 36 is a cleaning gas supply system that includes the first cleaning gas supply system and the second cleaning gas supply system.

In the present embodiment, a cleaning gas is supplied from the cleaning gas supply pipe 62a. As the cleaning gas, for example, hydrogen fluoride (HF) gas is supplied as a gas containing fluorine (fluorine-containing gas) from the cleaning gas supply pipe 62a into the process chamber 22 [mainly to the inner wall of the reaction tube 16] through the MFC 64a, the valve 66a, the gas supply pipe 42c, and the nozzle 40c. At this time, the inert gas may also be supplied from the inert gas supply pipes 52c and 52d into the process chamber 22 through the MFCs 54c and 54d, the valves 56c and 56d, the gas supply pipe 42c, and the nozzle 40c.

Similarly, the cleaning gas is supplied from the cleaning gas supply pipe 62b. As the cleaning gas, for example, hydrogen fluoride (HF) gas is supplied as a gas containing fluorine (fluorine-containing gas) from the cleaning gas supply pipe 62b into the process chamber 22 [mainly to an inner wall of the manifold 18] through the MFC 64b, the valve 66b, and the nozzle 40b. At this time, the inert gas may also be supplied from the inert gas supply pipe 52b into the cleaning gas supply pipe 62b through the MFC 54b and the valve 56b.

In the present embodiment, the third gas supply system 36 functions as a cleaning gas supply system.

In the present embodiment, a gas is transferred through the nozzle 40a and the nozzle 40c which are disposed in a toric longitudinal space formed by the inner wall of the reaction tube 16 and ends of a plurality of stacked wafers 24, that is, a cylindrical-shaped space. Through the gas supply hole 48a and the gas supply hole 48c, a gas is supplied into the reaction tube 16 in the vicinity of the wafer 24. A gas flow in the reaction tube 16 is mainly in a direction (horizontal direction) parallel to a surface of the wafer 24. Thereby, a gas is uniformly supplied to each of the wafers 24 accommodated in the process chamber 22 and a thin film having a uniform film thickness is formed on the wafer 24. A gas (a residual gas after reaction) flowing over a surface of the wafer 24 flows in a direction of the exhaust pipe 90. The direction in which the residual gas flows is not limited to a vertical direction but may be appropriately set according to a position of an exhaust port.

(Exhaust System)

In the reaction tube 16, the exhaust pipe 90 configured to exhaust an atmosphere in the process chamber 22 is provided. In the exhaust pipe 90, a vacuum pump 96 is connected as a vacuum exhaust device through a pressure sensor 92 configured to detect a pressure in the process chamber 22 as a pressure detector (pressure detecting unit) and an auto pressure controller (APC) valve 94 serving as a pressure regulator (pressure regulating unit). While the vacuum pump 96 is operated, vacuum-exhaust or vacuum-exhaust stop in the process chamber 22 is performed by opening or closing the APC valve 94. In addition, while the vacuum pump 96 is operated, a pressure in the process chamber 22 is adjusted by regulating a degree of valve opening of the APC valve.

An exhaust system mainly includes the exhaust pipe 90, the pressure sensor 92, and the APC valve 94. The vacuum pump 96 may also be included in the exhaust system. While the vacuum pump 96 is operated, the exhaust system regulates a degree of opening of the APC valve 94 based on information on the pressure detected by the pressure sensor 92, and thereby vacuum-exhausts such that the pressure in the process chamber 22 becomes a predetermined pressure (degree of vacuum). The exhaust pipe 90 is not limited to being provided in the reaction tube 16 but may also be provided in the manifold 18 similar to the nozzle 40a or the nozzle 40b.

(Opening and Closing Mechanism and Raising and Lowering Mechanism)

As a first furnace port cover, a seal cap 100 configured to hermitically close a lower-end opening of the manifold 18 is provided below the manifold 18. The seal cap 100 is configured to abut a lower end of the manifold 18 from a bottom side in a vertical direction. The seal cap 100 is made of a metal such as stainless and is formed in a disk shape. In a top surface of the seal cap 100, as a seal member, an O ring 20b abutting the lower end of the manifold 18 is provided.

In a side (a bottom side in FIG. 1) opposite to the process chamber 22 of the seal cap 100, a rotating mechanism 102 configured to rotate the boat 28 is provided. A rotary shaft 104 of the rotating mechanism 102 is made of a metal such as stainless and is connected to the boat 28 by penetrating the seal cap 100. The rotating mechanism 102 rotates the wafer 24 held on the boat 28 by rotating the boat 28.

A boat elevator 106 as a raising and lowering mechanism is vertically provided outside the reaction tube 16. The boat elevator 106 is configured to raise and lower the seal cap 100 in a vertical direction. The boat elevator 106 loads or unloads the boat 28 mounted on the seal cap 100 into or from the process chamber 22 by raising or lowering the seal cap 100. The boat elevator 106 functions as a transfer device (transfer mechanism) configured to transfer the boat 28 [and the wafer 24 held thereon] inside or outside the process chamber 22.

As a second furnace port cover, a shutter 110 configured to hermitically close a lower-end opening of the manifold 18 is provided below the manifold 18. The shutter 110 is formed in a disk shape and is made of a metal such as stainless. In a top surface of the shutter 110, as a seal member, an O ring 20c abutting the lower end of the manifold 18 is provided. The shutter 110 closes the lower-end opening when the seal cap 100 moves down and the lower-end opening of the manifold 18 is opened, and is retracted from the lower-end opening when the seal cap 100 moves up and the lower-end opening of the manifold 18 is closed. The shutter 110 is controlled such that an opening and closing operation (such as a raising and lowering operation and a rotational operation) is performed by a shutter opening and closing mechanism 112 provided outside the reaction tube 16.

Figure 3:
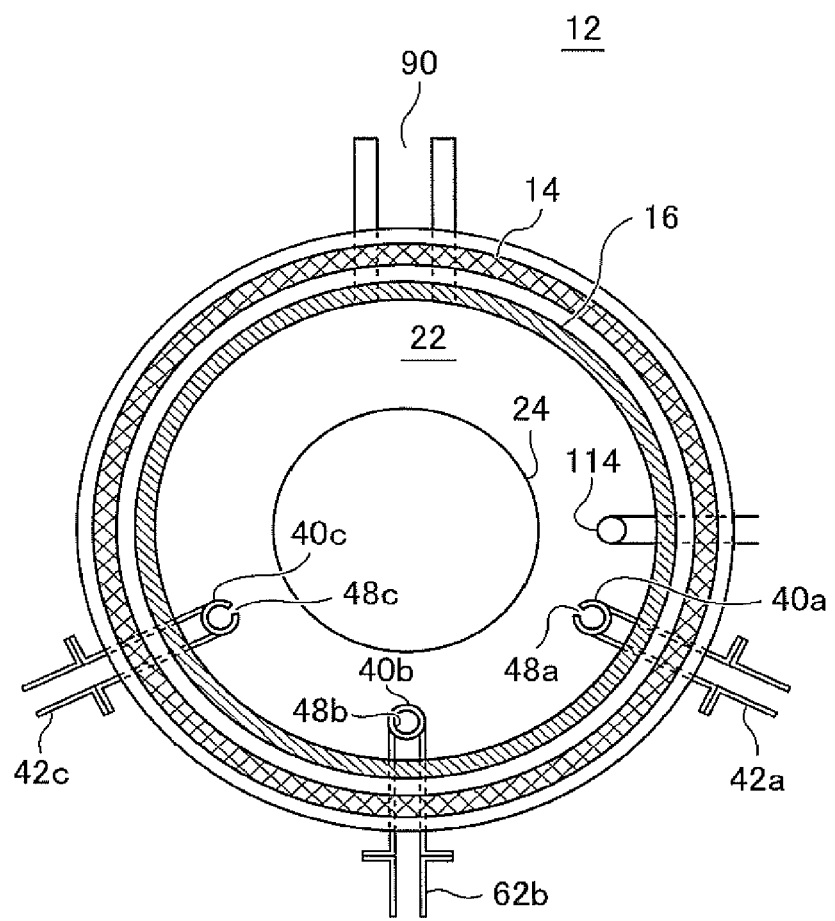
FIG. 3 is a schematic configuration diagram illustrating the vertical processing furnace of the substrate processing apparatus preferably used in the embodiment of the present invention and is a cross-sectional view illustrating the processing furnace part taken along the line A-A of FIG. 1.
Figure 4:
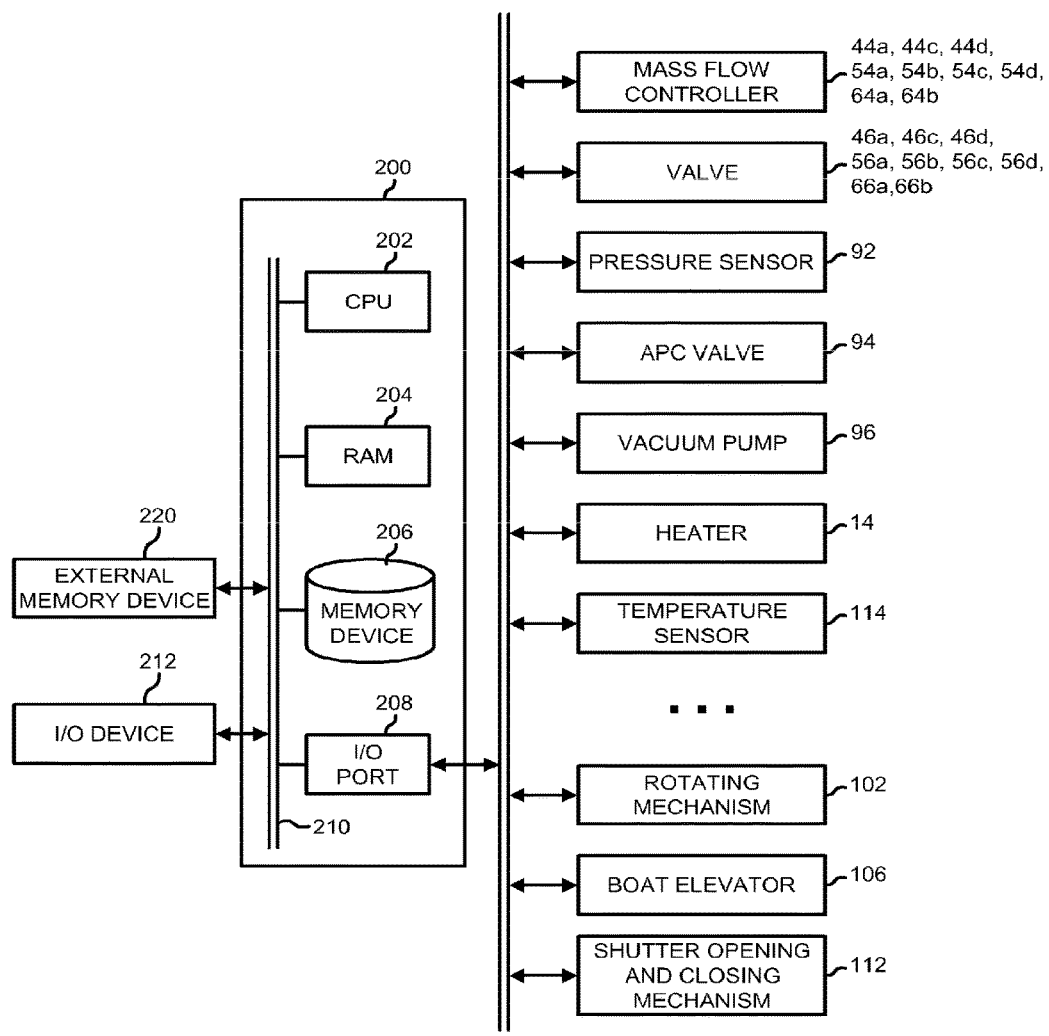
FIG. 4 is a schematic configuration diagram illustrating a controller of the substrate processing apparatus preferably used in the embodiment of the present invention and is a block diagram illustrating a control system of the controller.

In the reaction tube 16, a temperature sensor 114 serving as a temperature detector is provided (refer to FIG. 3). Power supply to the heater 14 is adjusted based on information on the temperature detected by the temperature sensor 114, and thereby a temperature in the process chamber 22 has a desired temperature distribution. The temperature sensor 114 is configured as an L-shape similar to the nozzle 40a and the nozzle 40c and is provided along the inner wall of the reaction tube 16.

A controller 200 serving as a control unit (control device) is configured as a computer which includes a central processing unit (CPU) 202, a random access memory (RAM) 204, a memory device 206, and an I/O port 208. The RAM 204, the memory device 206 and the I/O port 208 are configured to exchange data with the CPU 202 through an internal bus 210. An I/O device 212 such as a touch panel is connected to the controller 200.

The memory device 206 includes, for example, a flash memory and a hard disk drive (HDD). A control program controlling operations of a substrate processing apparatus 10, a process recipe describing sequences, conditions, and the like of substrate processing (film-forming process) (described later), a cleaning recipe describing sequences, conditions, and the like of a cleaning process (described later), and the like are readably stored in the memory device 206.

The process recipe, which is a combination of sequences, causes the controller 200 to execute each sequence in a substrate processing process in order to obtain a predetermined result, and functions as a program. Also, the cleaning recipe, which is a combination of sequences, causes the controller 200 to execute each sequence in a cleaning process (described later) in order to obtain a predetermined result, and functions as a program. Hereinafter, the process recipe, the cleaning recipe, the control program, and the like are collectively simply called a "program." In this specification, the term "program" may refer to only the process recipe, only the cleaning recipe, or only the control program, and any combination of the process recipe, the cleaning recipe and the control program.

The RAM 204 is configured as a memory area (work area) in which a program, data, and the like read by the CPU 202 are temporarily stored.

The I/O port 208 is connected to the MFCs 44a, 44c, 44d, 54a, 54b, 54c, 54d, 64a, and 64b, the valves 46a, 46c, 46d, 56a, 56b, 56c, 56d, 66a, and 66b, the pressure sensor 92, the APC valve 94, the vacuum pump 96, the heater 14, the temperature sensor 114, the rotating mechanism 102, the boat elevator 106, the shutter opening and closing mechanism 112, and the like.

The CPU 202 reads and executes the control program from the memory device 206, and reads the process recipe or the cleaning recipe from the memory device 206 according to an input of a manipulating command from the I/O device 212 and the like. To comply with content of the read process recipe or cleaning recipe, the CPU 202 is configured to control a flow rate adjustment operation of various types of gases by the MFCs 44a, 44c, 44d, 54a, 54b, 54c, 54d, 64a, and 64b, an opening and closing operation of the valves 46a, 46c, 46d, 56a, 56b, 56c, 56d, 66a, and 66b, a pressure adjustment operation by the APC valve 94 based on an opening and closing operation of the APC valve 94 and the pressure sensor 92, starting and stopping of the vacuum pump 96, a rotation and rotational speed regulating operation of the boat 28 by the rotating mechanism 102, a raising and lowering operation of the boat 28 by the boat elevator 106, an opening and closing operation of the shutter 110 by the shutter opening and closing mechanism 112, and the like.

The controller 200 is not limited to being configured as a dedicated computer but may be configured as a general-purpose computer. For example, an external memory device 220 storing the program is prepared, the program is installed in the general-purpose computer using the external memory device 220, and thereby the controller 200 according to the present embodiment may also be configured. Examples of the external memory device 220 may include a magnetic tape, a magnetic disk such as a flexible disk and a hard disk, an optical disc such as a CD and a DVD, a magneto-optical disc such as an MO, and a semiconductor memory such as a USB memory and a memory card.

A device for providing the program to the computer is not limited to the external memory device 220 for providing the program. For example, the program may also be provided using a communication unit such as the Internet or a dedicated line without the external memory device 220.

The memory device 206 or the external memory device 220 is configured as a non-transitory computer-readable recording medium. Hereinafter, these are also collectively simply called a recording medium. When the term "recording medium" is used in this specification, it refers to either or both of the memory device 206 and the external memory device 220.

(2) Substrate Processing Process

Next, as a process of a manufacturing process of a semiconductor device using the processing furnace 12 of the substrate processing apparatus 10, a method in which a process of forming a thin film on the wafer 24 as a substrate is performed, and then cleaning the inside of the process chamber 22 is performed will be described. Operations of respective units constituting the substrate processing apparatus 10 are controlled by the controller 200.

When the term "wafer" is used in this specification, it refers to the "wafer itself," or a "laminate (aggregate) of a wafer, a predetermined layer, film, and the like formed on a surface thereof" (that is, the wafer refers to a wafer including a predetermined layer, film, and the like formed on a surface thereof). In addition, when the term "surface of the wafer" is used in this specification, it refers to a "surface (exposed surface) of the wafer itself" or a "surface of a predetermined layer, film, and the like formed on the wafer, that is, the outermost surface of the wafer as the laminate."

Therefore, when it is described in this specification that "a predetermined gas is supplied to the wafer," it means that "a predetermined gas is directly supplied to a surface (exposed surface) of wafer itself" or "a predetermined gas is supplied to a layer, film, and the like formed on the wafer, that is, to the outermost surface of the wafer as the laminate." In addition, when it is described in this specification that "a predetermined layer (or film) is formed on the wafer," it means that "a predetermined layer (or film) is directly formed on a surface (exposed surface) of wafer itself" or "a predetermined layer (or film) is formed on a layer, film, and the like formed on the wafer, that is, form a predetermined layer (or film) on the outermost surface of the wafer as the laminate."

The terms "substrate" and "wafer" as used in this specification have the same meanings. Thus, the term "wafer" in the above description may be replaced with the term "substrate."

Hereinafter, an example in which a silicon oxide film ($SiO_2$ film, hereinafter also referred to as a "SiO film") is formed on the wafer 24 using HCDS gas as a source gas and $O_2$ gas and $H_2$ gas as a reaction gas, and then the inside of the process chamber 22 is cleaned using HF gas as a cleaning gas will be described with reference to FIGS. 5, 6, and 7.

<Wafer Charging and Boat Loading>

First, a plurality of wafers 24 are loaded on the boat 28 (wafer charging). When the wafers 24 are loaded on the boat 28, the shutter 110 is moved by the shutter opening and closing mechanism 112, and thereby the lower-end opening of the manifold 18 is opened (shutter opening). The boat 28 on which the plurality of wafers 24 are held is lifted by the boat elevator 106 and is loaded (boat loading) in the process chamber 22. The seal cap 100 seals the lower end of the manifold 18 through the O ring 20b.

<Pressure Adjustment and Temperature Adjustment>

Subsequently, the inside of the process chamber 22 is vacuum-exhausted to a desired pressure (degree of vacuum) by the vacuum pump 96. At this time, the pressure in the process chamber 22 is measured by the pressure sensor 92, and the APC valve 94 is feedback-controlled (pressure adjustment) based on information on the measured pressure. The vacuum pump 96 constantly operates while at least processing on the wafer 24 is completed.

The inside of the process chamber 22 is heated to a desired temperature by the heater 14. At this time, based on information on the temperature detected by the temperature sensor 114, power supply to the heater 14 is feedback-controlled (temperature adjustment) such that the inside of the process chamber 22 has a desired temperature distribution. Heating the inside of the process chamber 22 by the heater 14 is continuously preformed while at least processing on the wafer 24 is completed.

Subsequently, the boat 28 and the wafer 24 are rotated by the rotating mechanism 102. Rotation of the boat 28 and the wafer 24 by the rotating mechanism 102 is continuously preformed while at least processing on the wafer 24 is completed.

<Process of Forming Silicon Oxide Film>

Figure 5:
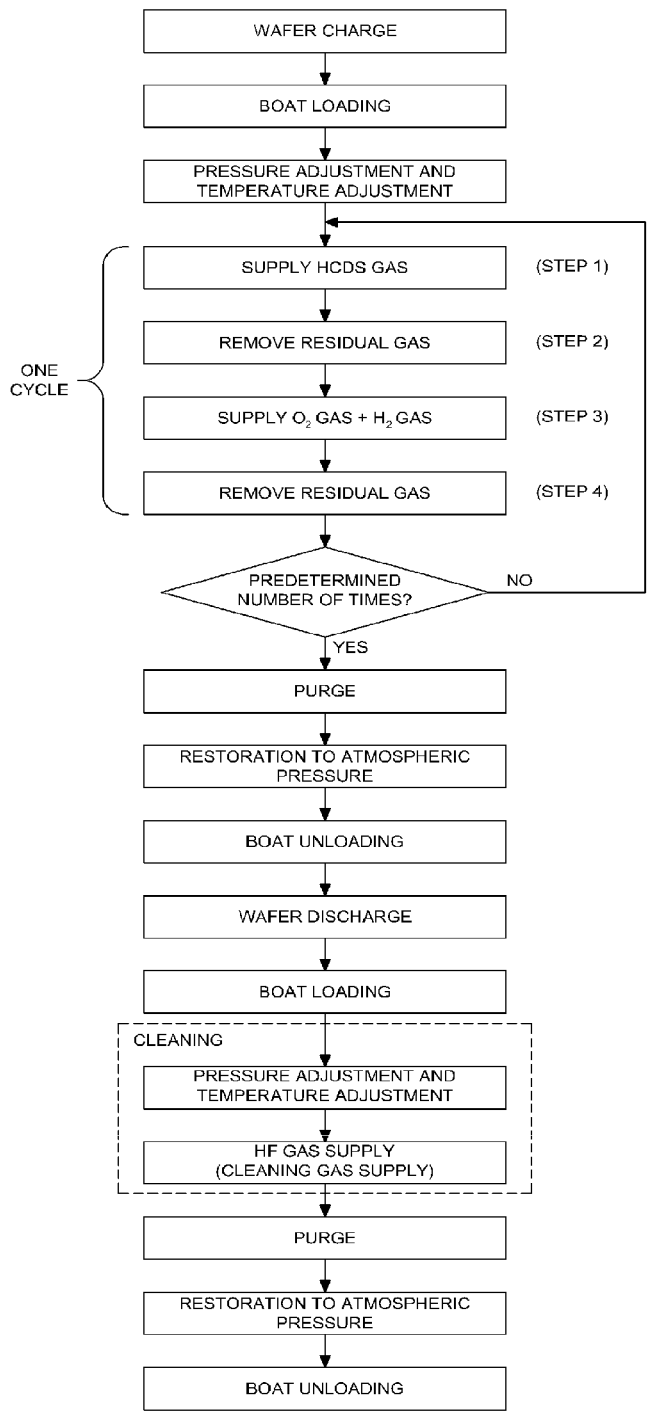
FIG. 5 is a flowchart illustrating a substrate processing process of the present invention.
Figure 6:
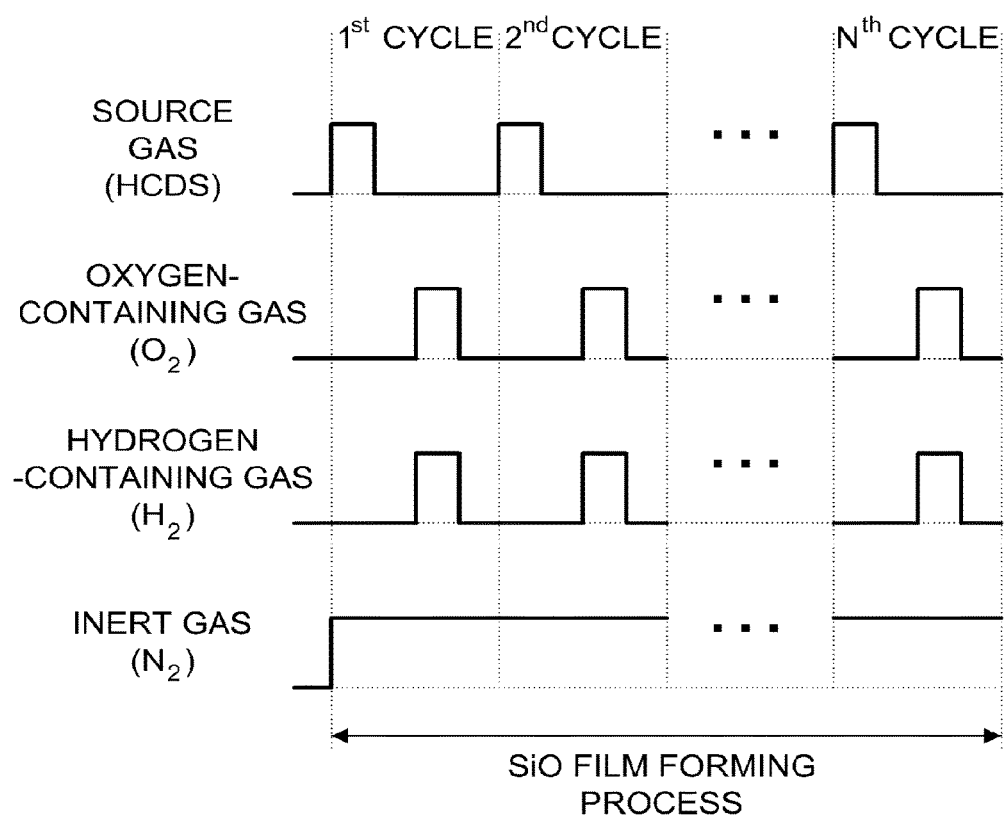
FIG. 6 is a diagram illustrating a timing of supplying a gas in a film-forming sequence of the present invention.

Then, as illustrated in FIGS. 5 and 6, a SiO film having a predetermined film thickness is formed on the wafer 24 by performing a cycle including the following steps 1 to 4 a predetermined number of times.

(Step 1)

In step 1, a source gas (HCDS gas) is supplied to the wafer 24 accommodated in the process chamber 20 and a layer (silicon-containing layer) is formed on the wafer 24.

First, the valve 46a of the gas supply pipe 42a is opened, and the HCDS gas flows into the gas supply pipe 42a. The HCDS gas flows from the gas supply pipe 42a and a flow rate thereof is adjusted by the MFC 44a. The HCDS having the adjusted flow rate is supplied from the gas supply hole 48a of the nozzle 40a toward the wafer 24 in the process chamber 22 in a heated and depressurized state and is exhausted from the exhaust pipe 90. In this manner, the HCDS gas is supplied to the wafer 24 (HCDS gas supply).

At this time, the valve 56a of the inert gas supply pipe 52a is opened, and $N_2$ gas may also be supplied as an inert gas from the inert gas supply pipe 52a. A flow rate of the $N_2$ gas is adjusted by the MFC 54a and the $N_2$ gas is supplied into the gas supply pipe 42a. The $N_2$ gas having the adjusted flow rate and the HCDS gas having the adjusted flow rate are mixed in the gas supply pipe 42a, are supplied from the gas supply hole 48a of the nozzle 40a into the process chamber 22 in a heated and depressurized state, and are exhausted from the exhaust pipe 90.

In order to prevent the HCDS gas from being introduced into the nozzles 40b and 40c, the valves 56b, 56c, and 56d are opened, and the $N_2$ gas flows into the inert gas supply pipes 52b, 52c, and 52d. The $N_2$ gas is supplied into the process chamber 22 through the cleaning gas supply pipe 62b, the gas supply pipe 42c, the gas supply pipe 42d, the nozzle 40b and the nozzle 40c, and is exhausted from the exhaust pipe 90.

At this time, the APC valve 94 is adjusted such that the pressure in the process chamber 22 falls within, for example, a range of 1 Pa to 13,300 Pa, and preferably 10 Pa to 1,330 Pa. A supply flow rate of the HCDS gas controlled by the MFC 44a is set to have a flow rate of, for example, a range of 1 sccm to 1,000 sccm. A supply flow rate of the $N_2$ gas controlled by the MFCs 54a, 54b, 54c, and 54d is set to fall within, for example, a range of 100 sccm to 2,000 sccm. A time for supplying the HCDS gas to the wafer 24, that is, a gas supply time (radiation time), is set to fall within, for example, the range of 1 second to 120 seconds.

The temperature of the heater 14 is set such that the temperature of the wafer 24 falls within, for example, a range of 350° C. to 800° C., preferably 450° C. to 800° C., and more preferably 550° C. to 750° C.

When the temperature of the wafer 24 is less than 350° C., the HCDS is hardly decomposed and adsorbed on the wafer 24, and thereby a practical film-forming rate may not be obtained. When the temperature of the wafer 24 is set to 350° C. or more, this problem is addressed and thereby a sufficient film-forming rate may be obtained. When the temperature of the wafer 24 is set to 450° C. or more, an effect of oxidizing power improvement is significant in step 3 (described later). When the temperature of the wafer 24 is set to 550° C. or more, the HCDS is sufficiently decomposed.

When the temperature of the wafer 24 is set to 750° C., and particularly, more than 800° C., a CVD reaction becomes strong [a gas-phase reaction is dominant] so that film thickness uniformity is likely to be degraded and thereby control thereof may be difficult. When the temperature of the wafer 24 is set to 800° C. or less, degradation of the film thickness uniformity is suppressed and thereby control thereof becomes easier. In particular, when the temperature of the wafer 24 is set to 750° C. or less, the film thickness uniformity is easily secured and thereby control thereof becomes easy.

Under the above-described conditions, when the HCDS gas is supplied to the wafer 24, a silicon-containing layer (Si-containing layer) having a thickness of, for example, about less than one atomic layer to several atomic layers is formed on the wafer 24 [an underlying film of a surface]. The Si-containing layer may include either or both of a silicon layer (Si layer) and an adsorption layer of the HCDS gas. Preferably, the Si-containing layer is a layer containing silicon (Si) and chlorine (Cl).

The Si layer generically refers to a continuous layer formed of Si, a discontinuous layer, or a Si thin film formed by overlapping these layers. The continuous layer formed of Si may also be called a Si thin film. Si forming the Si layer also includes Si in which a bond with Cl is not completely disconnected.

The adsorption layer of the HCDS gas includes a chemical adsorption layer in which gas molecules of the HCDS gas are continuous and a chemical adsorption layer in which gas molecules of the HCDS gas are discontinuous. That is, the adsorption layer of the HCDS gas includes a chemical adsorption layer that is formed of the HCDS molecules and has a thickness of one molecule layer or less than one molecule layer. The HCDS ($Si_2Cl_6$) molecules forming the adsorption layer of the HCDS gas also include molecules in which a bond between Si and Cl is partially disconnected.

"Layer having a thickness of less than one atomic layer" refers to a discontinuously formed atomic layer. "Layer having a thickness of one atomic layer" refers to a continuously formed atomic layer. "Layer having a thickness of less than one molecule layer" refers to a discontinuously formed molecule layer. "Layer having a thickness of one molecule layer" refers to a continuously formed molecule layer.

Under conditions in which the HCDS gas is self-decomposed (pyrolyzed), that is, conditions causing a pyrolysis reaction of the HCDS, when Si is deposited on the wafer 24, the Si layer is formed. Under conditions in which the HCDS gas is not self-decomposed (pyrolyzed), that is, conditions that do not cause a pyrolysis reaction of the HCDS, when the HCDS gas is adsorbed on the wafer 24, the adsorption layer of the HCDS gas is formed. Forming the Si layer on the wafer 24 is preferable since a film-forming rate is higher when the Si layer is formed on the wafer 24 than when the adsorption layer of the HCDS gas is formed on the wafer 24, When the thickness of the Si-containing layer formed on the wafer 24 is more than several atomic layers, an oxidation (modification) action in step 3 does not influence on the entire Si-containing layer. Also, a minimum thickness of the Si-containing layer that can be formed on the wafer 24 is less than one atomic layer. Therefore, preferably, the Si-containing layer may be set to have a thickness of less than one atomic layer to several atomic layers.

When the thickness of the Si-containing layer is set to one atomic layer or less, that is, one atomic layer or less than one atomic layer, an action of an oxidation reaction (modifying reaction) in step 3 relatively increases, and a time required for the oxidation reaction in step 3 decreases. Also, a time required for forming the Si-containing layer in step 1 decreases. Thereby, a processing time required for performing one cycle decreases, and a processing time in total decreases. That is, the film-forming rate increases. In addition, when the thickness of the Si-containing layer is set to one atomic layer or less, controllability of the film thickness uniformity increases.

The HCDS gas supplied into the process chamber 22 is supplied to the wafer 24 and is also supplied to a surface of a member in the process chamber 22 [a surface of a member such as the inner wall of the reaction tube 16, the inner wall of the manifold 18, and the boat 28 provided in the process chamber 22]. Thereby, the Si-containing layer is formed on the wafer 24 and is also formed on the surface of the member in the process chamber 22. The Si-containing layer formed on the surface of the member in the process chamber 22 may also include either or both of a silicon layer (Si layer) and an adsorption layer of the HCDS gas as in the Si-containing layer formed on the wafer 24.

As the source gas (a gas containing silicon and chlorine), instead of the HCDS gas, tetrachlorosilane (silicon tetrachloride, $SiCl_4$, abbreviated to STC) gas, trichlorosilane ($SiHCl_3$, abbreviated to TCS) gas, dichlorosilane ($SiH_2Cl_2$, abbreviated to DCS) gas, and monochlorosilane ($SiH_3Cl$, abbreviated to MCS) gas may also be used. As the inert gas, instead of the $N_2$ gas, a rare gas such as argon (Ar), helium (He), neon (Ne), and xenon (Xe) may also be used.

(Step 2)

After the Si-containing layer is formed on the wafer 24, the valve 46a of the gas supply pipe 42a is closed to suspend supply of the HCDS gas. While the APC valve 94 of the exhaust pipe 90 is opened, the inside of the process chamber 22 is vacuum-exhausted by the vacuum pump 96, and a residual gas (an unreacted HCDS gas and/or an HCDS gas that has contributed to formation of the Si-containing layer) in the process chamber 22 is removed from the inside of the process chamber 22 (residual gas removal).

While the valves 56a, 56b, 56c, and 56d are opened, supply of the $N_2$ gas into the process chamber 22 continues. The $N_2$ gas serves as a purge gas and an effect of removing the residual gas in the process chamber 22 from the inside of the process chamber 22 increases. The HCDS gas adsorbed on the member in the process chamber 22 in step 1 is not completely removed by vacuum-exhausting the inside of the process chamber 22, and at least some gas remains while being adsorbed on the surface of the member in the process chamber 22.

In this case, the residual gas in the process chamber 22 may not be completely removed and the inside of the process chamber 22 may not be completely purged. When an amount of the residual gas in the process chamber 22 is small, there is no substantial influence in step 3 performed thereafter. There is no need to set a flow rate of the $N_2$ gas supplied into the process chamber 22 to be high. For example, when the same amount of the $N_2$ gas as a volume of the process container [the process chamber 22] is supplied, it is possible to purge to the extent that there is no substantial influence in step 3. When the inside of the process chamber 22 is not completely purged in this way (the next process begins at a step at which the gases have been purged to some extent), a purge time decreases, thereby improving the throughput. Also, it is possible to suppress unnecessary consumption of the $N_2$ gas to the minimum.

Similar to the temperature of the wafer 24 when the HCDS gas is supplied, the temperature of the heater 14 is set to fall within, for example, a range of 350° C. to 800° C., preferably 450° C. to 800° C., and more preferably 550° C. to 750° C. The supply flow rate of the $N_2$ gas supplied from each inert gas supply system as a purge gas is set to have a flow rate of, for example, a range of 100 sccm to 2,000 sccm. As the purge gas, instead of the $N_2$ gas, a rare gas such as Ar, He, Ne, and Xe may also be used.

(Step 3)

In step 3, as a reaction gas, the $O_2$ gas and the $H_2$ gas are supplied to the heated wafer 24 in the process chamber 20 under sub-atmospheric pressure. The layer (Si-containing layer) formed in step 1 is oxidized and modified to an oxide layer.

After the residual gas in the process chamber 22 is removed, the valve 46c of the gas supply pipe 42c is opened and the $O_2$ gas flows into the gas supply pipe 42c. The $O_2$ gas flows from the gas supply pipe 42c and a flow rate thereof is adjusted by the MFC 44c. The $O_2$ gas having the adjusted flow rate is supplied from the gas supply hole 48c of the nozzle 40c into the process chamber 22 in a heated and depressurized state.

The valve 46d of the gas supply pipe 42d is opened and the $H_2$ gas flows into the gas supply pipe 42d. The $H_2$ gas flows from the gas supply pipe 42d and a flow rate thereof is adjusted by the MFC 44d. The $H_2$ gas having the adjusted flow rate is supplied from the gas supply hole 48c of the nozzle 40c into the process chamber 22 in a heated and depressurized state through the gas supply pipe 42c.

When the $H_2$ gas passes through the gas supply pipe 42c, the $H_2$ gas is mixed with the $O_2$ gas in the gas supply pipe 42c. The mixed gas of the $O_2$ gas and the $H_2$ gas is supplied from the gas supply hole 48c of the nozzle 40c to the wafer 24 in the process chamber 22 in a heated and depressurized state, and then is exhausted from the exhaust pipe 90. In this manner, the $O_2$ gas and the $H_2$ gas are supplied to the wafer 24 ($O_2$ gas+$H_2$ gas supply).

At this time, the valve 56c of the inert gas supply pipe 52c is opened and the $N_2$ gas may also be supplied from the inert gas supply pipe 52c. A flow rate of the $N_2$ gas is adjusted by the MFC 54c and the $N_2$ gas is supplied into the gas supply pipe 42c. Also, the valve 56d of the inert gas supply pipe 52d is opened and the $N_2$ gas may also be supplied as an inert gas from the inert gas supply pipe 52d. A flow rate of the $N_2$ gas is adjusted by the MFC 54d and the $N_2$ gas is supplied into the gas supply pipe 42c. In this case, a mixed gas of the $O_2$ gas, the $H_2$ gas and the $N_2$ gas is supplied from the nozzle 40c. As the inert gas, instead of the $N_2$ gas, a rare gas such as Ar, He, Ne, and Xe may also be used.

In order to prevent the $O_2$ gas and $H_2$ gas from being introduced into the nozzles 40a and 40b, the valves 56a and 56b are opened, and the $N_2$ gas flows into the inert gas supply pipes 52a and 52b. The $N_2$ gas is supplied into the process chamber 22 through the gas supply pipe 42a and the nozzle 40a, the cleaning gas supply pipe 62b and the nozzle 40b, and is exhausted from the exhaust pipe 90.

By adjusting the APC valve 94, the pressure in the process chamber 22 is maintained below atmospheric pressure, for example, in a range of 1 Pa to 1,000 Pa. The supply flow rate of the $O_2$ gas controlled by the MFC 44c is set to have a flow rate of, for example, a range of 1,000 sccm to 10,000 sccm. The supply flow rate of the $H_2$ gas controlled by the MFC 44d is set to have a flow rate of, for example, a range of 1,000 sccm to 10,000 sccm. The supply flow rate of the $N_2$ gas controlled by the MFCs 54a, 54b, 54c, and 54d is set to have a flow rate of, for example, a range of 100 sccm to 2,000 sccm. A time for supplying the $O_2$ gas and the $H_2$ gas to the wafer 24, that is, a gas supply time [radiation time] is set to fall within, for example, a range of 1 second to 120 seconds.

Similar to the temperature range of the wafer 24 when the HCDS gas is supplied in step 1, the temperature of the heater 14 is set to have the temperature range in which oxidizing power is significantly improved (described later), for example, a range of 450° C. to 800° C., and preferably 550° C. to 750° C. When the temperature falls within this range, oxidizing power significantly increases by adding the $H_2$ gas to the $O_2$ gas under a depressurized atmosphere. In addition, when the temperature of the wafer 24 is excessively low, it is difficult to increase the oxidizing power.

In consideration of the throughput, it is preferable that the temperature of the heater 14 be set to maintain the temperature in the process chamber 22 from steps 1 to 3 to the same temperature range. It is preferable that the temperature of the heater 14 be set to maintain the temperature in the process chamber 22 from steps 1 to 4 to the same temperature range. In this case, the temperature of the heater 14 is set such that the temperature in the process chamber 22 is maintained constant to fall within, for example, a range of 450° C. to 800° C., and preferably 550° C. to 750° C., from steps 1 to 4.

Under the above-described conditions, when the $O_2$ gas and the $H_2$ gas are supplied into the process chamber 22, the $O_2$ gas and the $H_2$ gas are thermally activated (excited) as non-plasma and reacted under a heated and depressurized atmosphere. Thereby, a water ($H_2O$)-free oxidizing species which contains oxygen such as atomic oxygen (O) is generated. Then, the oxidation reaction is mainly performed on the Si-containing layer formed on the wafer 24 in step 1 by this oxidizing species. Since energy of the oxidizing species is higher than bond energy of Si—N, Si—Cl, Si—H, and Si—C included in the Si-containing layer, when the energy of the oxidizing species is applied to the Si-containing layer, bonds of Si—N, Si—Cl, Si—H, and Si—C included in the Si-containing layer are disconnected. N, H, Cl, and C, whose bonds with Si are disconnected, are removed from the film and discharged as $N_2$, $H_2$, $Cl_2$, HCl, $CO_2$, and the like. Also, when bonds with N, H, Cl, and C are disconnected, the remaining bonds of Si combine with O included in the oxidizing species and Si—O bonds are formed. In this way, the Si-containing layer is changed to a silicon oxide layer ($SiO_2$ layer, hereinafter referred to simply as a SiO layer) having low content of impurities such as Cl (modified).

According to the oxidation reaction, it is possible to significantly increase the oxidizing power compared to when only the $O_2$ gas is supplied or water vapor ($H_2O$) is supplied. Under a depressurized atmosphere, when the $H_2$ gas is added with the $O_2$ gas, it is possible to significantly increase the oxidizing power compared to when only the $O_2$ gas is supplied or the $H_2O$ gas is supplied.

The oxidizing species generated in the process chamber 22 is supplied to the wafer 24 and is also supplied to the surface of the member in the process chamber 22. As a result, a part of the Si-containing layer formed on the surface of the member in the process chamber 22 is changed to a SiO layer similar to the Si-containing layer formed on the wafer 24 (modified).

In step 3, either or both of the $O_2$ gas and the $H_2$ gas may flow by being activated as plasma. When the $O_2$ gas and/or the $H_2$ gas flow by being activated as plasma, the oxidizing species including an active species having higher energy may be generated. When the oxidation reaction is performed using this oxidizing species, device characteristics may also improve.

In the above-described temperature range, when the $O_2$ gas and the $H_2$ gas are activated by heat and sufficiently reacted, an $H_2O$-free oxidizing species such as atomic oxygen (O) is sufficiently generated. Thereby, when the $O_2$ gas and the $H_2$ gas are thermally activated as non-plasma, it is possible to obtain sufficient oxidizing power. When the $O_2$ gas and the $H_2$ gas are supplied by being activated by heat, there is no plasma damage and a relatively soft reaction can be generated. Therefore, it is possible to perform the above-described oxidation reaction relatively softly.

As the oxygen-containing gas, that is, the oxidizing gas, instead of the $O_2$ gas, ozone ($O_3$) gas and the like may also be used. In the above-described temperature range, a test was performed to observe an effect of adding the hydrogen-containing gas to nitric oxide (NO) gas or nitrous oxide ($N_2O$) gas. The result showed that an effect of oxidizing power improvement is not obtained compared to when only the NO gas or the $N_2O$ gas is supplied. As the oxygen-containing gas, an N-free oxygen-containing gas (a gas containing O without N) is preferably used.

As the hydrogen-containing gas, that is, the reducing gas, instead of the $H_2$ gas, deuterium ($D_2$) gas and the like may also be used. When ammonia ($NH_3$) gas, methane ($CH_4$) gas, and the like are used, nitrogen (N) impurities or carbon (C) impurities may be considered to be mixed into the film. As the hydrogen-containing gas, an other-element-free hydrogen-containing gas (a gas containing hydrogen or deuterium without any other elements) is preferably used.

As the oxygen-containing gas, at least one gas selected from the group consisting of the $O_2$ gas and the $O_3$ gas may be used. As the hydrogen-containing gas, at least one gas selected from the group consisting of the $H_2$ gas and the $D_2$ gas may be used.

(Step 4)

After the Si-containing layer is changed to the SiO oxide layer, the valve 46c of the gas supply pipe 42c is closed to suspend supply of the $O_2$ gas. Also, the valve 46d of the gas supply pipe 42d is closed to suspend supply of the $H_2$ gas. While the APC valve 94 of the exhaust pipe 90 is opened, the inside of the process chamber 22 is vacuum-exhausted by the vacuum pump 96, and the remaining $O_2$ gas and $H_2$ gas, the reaction by-products, and the like are removed from the inside of the process chamber 22 (removal of residual gas). While the valves 56a, 56b, 56c, and 56d are opened, supply of the $N_2$ gas as an inert gas into the process chamber 22 is maintained. The $N_2$ gas serves as a purge gas and further increases an effect of removing the unreacted gas or $O_2$ gas that has contributed to formation of the SiO layer, the $H_2$ gas, the reaction by-products, and the like remaining in the process chamber 22 from the inside the process chamber 22.

At this time, the residual gas in the process chamber 22 may not be completely removed and the inside of the process chamber 22 may not be completely purged. When an amount of the residual gas in the process chamber 22 is small, there is no substantial influence in step 1 performed thereafter. There is no need to set a flow rate of the $N_2$ gas supplied into the process chamber 22 to be high. For example, when the same amount of the $N_2$ gas as a volume of the reaction tube 16 [the process chamber 22] is supplied, it is possible to purge to the extent that there is no substantial influence in step 1. When the inside of the process chamber 22 is not completely purged in this way (the next process begins at a step at which the gases are purged to some extent), a purge time decreases, thereby improving the throughput. Also, it is possible to suppress unnecessary consumption of the $N_2$ gas to the minimum.

Similar to the temperature of the wafer 24 when the $O_2$ gas and the $H_2$ gas are supplied, the temperature of the heater 14 is set to fall within, for example, a range of 450° C. to 800° C., and preferably 550° C. to 750° C. The supply flow rate of the $N_2$ gas supplied as a purge gas from each inert gas supply system is set to have a flow rate of, for example, a range of 100 sccm to 2,000 sccm. As the purge gas, instead of the $N_2$ gas, a rare gas such as Ar, He, Ne, and Xe may also be used.

<Performing Predetermined Number of Times>

When a cycle including steps 1 to 4 is performed a predetermined number of times (n times), a SiO film having a predetermined film thickness is formed on the wafer 24.

<Purging and Restoring to Atmospheric Pressure>

After the SiO film having a predetermined film thickness is formed, the valves 56a, 56b, 56c, and 56d are opened, and the $N_2$ gas is supplied as an inert gas from each of the inert gas supply pipes 52a, 52b, 52c, and 52d into the process chamber 22 and is exhausted from the exhaust pipe 90. The $N_2$ gas serves as a purge gas, the inside of the process chamber 22 is purged with the inert gas, and the residual gas in the process chamber 22 is removed from the inside of the process chamber 22 (purge). Then, the atmosphere in the process chamber 22 is replaced with the inert gas, and the pressure in the process chamber 22 is restored to the normal pressure (restoration to atmospheric pressure).

<Boat Unloading and Wafer Discharge>

The seal cap 100 is lowered by the boat elevator 106, and thereby the lower end of the manifold 18 is opened, and the processed wafer 24 is unloaded (boat unloading) to the outside of the reaction tube 16 from the lower end of the manifold 18 while being held on the boat 28. After the boat is unloaded, the shutter 110 moves by the shutter opening and closing mechanism 112 and the lower-end opening of the manifold 18 is sealed by the shutter 110 through the O ring 20c (shutter closing). Then, the processed wafer 24, that is, the batch-processed wafer 24, is extracted from the boat 28 (wafer discharge).

<Cleaning Process>

Subsequently, cleaning of the inside of the process chamber 22 is performed. During the process of forming the SiO film, a film is also deposited on inner walls of the reaction tube 16 and the manifold 18, the surface of the boat 28, and the like. This deposited film (deposition film) is accumulated and becomes gradually thicker when the above-described batch process is repeatedly performed. This accumulated deposition film is released therefrom in a subsequent process and is adhered to the wafer 24, thereby becoming a foreign material. For this reason, in preparation for the subsequent process, the deposition film is removed from the inside of the process chamber 22 when the deposition film has a predetermined thickness.

(Boat Loading)

The boat 28 [empty boat 28] having no wafer 24 loaded thereon is loaded in the process chamber 22 according to the same sequences as in the above-described boat loading.

(Pressure Adjustment and Temperature Adjustment)

The inside of the process chamber 22 is vacuum-exhausted to a desired pressure (degree of vacuum) by the vacuum pump 96. At this time, the pressure in the process chamber 22 is measured by the pressure sensor 92, and the APC valve 94 is feedback-controlled based on information on the measured pressure (pressure adjustment). The vacuum pump 96 constantly operates while at least cleaning of the inside of the process chamber 22 is completed.

The inside of the process chamber 22 is heated to a desired temperature by the heater 14. At this time, based on information on the temperature detected by the temperature sensor 114, power supply to the heater 14 is feedback-controlled (temperature adjustment) such that the inside of the process chamber 22 has a desired temperature distribution. Heating the inside of the process chamber 22 by the heater 14 is continuously preformed while at least cleaning of the inside of the process chamber 22 is completed.

Subsequently, the boat 28 is rotated by the rotating mechanism 102. Rotation of the boat 28 by the rotating mechanism 102 is continuously performed while at least cleaning of the inside of the process chamber 22 is completed. Also, the boat 28 may not be rotated.

Cleaning Gas Supply

Example 1

Subsequently, a cleaning gas is supplied into the process chamber 22. In Example 1 of a cleaning gas supply pattern, as illustrated in FIG. 7, first, the cleaning gas is supplied from the nozzle 40c and then the cleaning gas is supplied from the nozzle 40b.

Since the nozzle 40c is used to supply the reaction gas for modifying the Si-containing layer formed on the wafer 24, it is configured to supply the gas to the vicinity of the wafer 24 accommodated in the process chamber 22. Thereby, the nozzle 40c is more likely to supply the gas to the reaction tube 16 side, that is a part (top in FIG. 1) in which the wafer 24 in the process chamber 22 is accommodated, than the manifold 18 side. Therefore, when the gas is supplied from the nozzle 40c, the reaction tube 16 side is more likely to be cleaned than the manifold 18 side. On the other hand, the nozzle 40b is configured to supply the gas to the manifold 18 side rather than the nozzle 40c. Thereby, the nozzle 40b is more likely to supply the gas to the manifold 18 side, for example, the inner wall surface of the manifold 18, than the reaction tube 16 side. As a result, when the gas is supplied from the nozzle 40b, the manifold 18 side is more likely to be cleaned than the reaction tube 16 side.

Also, the HCDS gas supplied into the process chamber 22 in step 1 is supplied to the wafer 24 and is also supplied to the surface of the member in the process chamber. In addition, the oxidizing species generated in the process chamber 22 in step 3 is supplied to the wafer 24 and is also supplied to the surface of the member in the process chamber 22. As a result, a part of the Si-containing layer formed on the surface of the member in the process chamber 22 in step 1 is changed (modified) to the SiO layer similar to the Si-containing layer formed on the wafer 24 in step 3. However, in step 3, a supply amount of the $H_2O$-free oxidizing species containing oxygen such as atomic oxygen (O) becomes smaller in the low-temperature region [a region that is not surrounded by the heater 14 and is a region other than a region horizontally surrounding the wafer arrangement region] in the process chamber 22 than the high-temperature region [a region that is surrounded by the heater 14 and is a region horizontally surrounding the wafer arrangement region]. In addition, in step 1, the adsorption layer of the HCDS gas is likely to be formed thicker in the low-temperature region of the process chamber 22 than the high-temperature region. As a result, the Si-containing layer formed on the low-temperature region is unreacted or partially reacted, and is likely to remain in an insufficient oxidation state. Specifically, the adsorption layer of the HCDS gas formed on a lower part of the inner wall of the reaction tube 16, the inner wall of the manifold 18, lower parts of the nozzles 40a and 40c, the top surface of the seal cap 100, a side surface of the rotary shaft 104, a side surface or a bottom surface of the insulation member 30, the inner wall of the exhaust pipe 90, and the like out of the members in the process chamber 22 is unreacted or partially reacted, and is likely to remain in an insufficient oxidation state.

In addition, when the boat unloading is performed, outside air [atmosphere] containing $H_2O$ is introduced from the lower-end opening of the manifold 18 into the process chamber 22. Thereby, the inner wall of the manifold 18, the top surface of the seal cap 100, the side surface of the rotary shaft 104, the side surface or the bottom surface of the insulation member 30, and the like are exposed to the atmosphere containing $H_2O$. As described above, the thick adsorption layer of the HCDS gas is formed on the lower part of the inner wall of the reaction tube 16, the inner wall of the manifold 18, the lower parts of the nozzles 40a and 40c, the top surface of the seal cap 100, the side surface of the rotary shaft 104, the side surface or the bottom surface of the insulation member 30, the inner wall of the exhaust pipe 90, and the like out of the members in the process chamber 22, and remains in an insufficient oxidation state. When the boat unloading is performed in this state, the adsorption layer of the HCDS gas may be oxidized by the $H_2O$ in the atmosphere and changed to reaction by-products containing Cl. Also, a film (deposition film) formed by deposition of the reaction by-products is relatively fragile and easily released therefrom, thereby easily becoming a foreign material (particles).

For this reason, when the cleaning gas is supplied from a side closer to the manifold 18 toward the low-temperature region, even if the deposition film, which is relatively fragile and easily released therefrom, is formed on the low-temperature region, this deposition film is easily cleaned and the deposition film is effectively removed from the inside of the process chamber 20.

Figure 7:
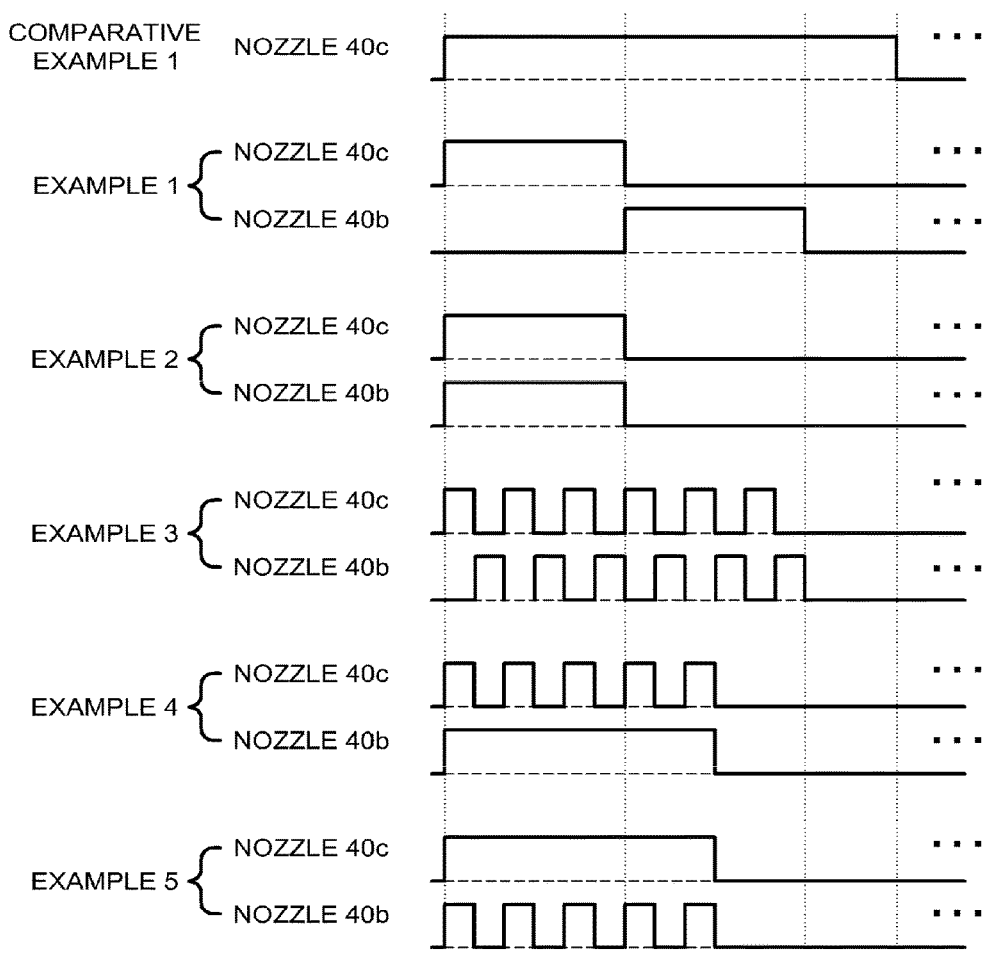
FIG. 7 is a diagram illustrating a timing of supplying a cleaning gas when cleaning is performed.

In this manner, when the cleaning gas is supplied from the nozzle 40c and the nozzle 40b, a time required for cleaning the inside of the process chamber 22 is reduced compared to when only the nozzle 40c is used to supply the cleaning gas (Comparative Example 1 in FIG. 7).

In the process of supplying the cleaning gas, specifically, the valve 66a of the cleaning gas supply pipe 62a is opened and the HF gas flows into the cleaning gas supply pipe 62a. The HF gas flows from the cleaning gas supply pipe 62a and a flow rate thereof is adjusted by the MFC 64a. The HF gas having the adjusted flow rate is supplied from the gas supply hole 48c of the nozzle 40c into the process chamber 22, comes in contact with the inner walls of the reaction tube 16 and the manifold 18, the surface of the boat 28, and the like, and is exhausted from the exhaust pipe 90. At this time, the valve 56b of the inert gas supply pipe 52b is opened and the $N_2$ gas is supplied as an inert gas from the nozzle 40b. By the HF gas supplied from the nozzle 40c and the $N_2$ gas supplied from the nozzle 40b, as illustrated in FIG. 8a, cleaning is mainly performed on a region having a relatively high temperature such as the inner wall of the reaction tube 16, the surface of the boat 28, and the like (high-temperature region cleaning).

Also, at this time, in order to prevent the HF gas from being introduced into the nozzle 40a, it is preferable that the valve 56a be opened and the N₂ gas flow into the inert gas supply pipe 52a. In this case, the N₂ gas is supplied into the process chamber 22 through the gas supply pipe 42a and the nozzle 40a and is exhausted from the exhaust pipe 90.

After the HF gas is supplied from the nozzle 40c for a predetermined time, the valve 66a of the cleaning gas supply pipe 62a and the valve 56b of the inert gas supply pipe 52b are closed to suspend supply of the HF gas from the cleaning gas supply pipe 62a and supply of the N₂ gas from the inert gas supply pipe 52b. Subsequently, the valve 66b of the cleaning gas supply pipe 62b is opened and the HF gas flows into the cleaning gas supply pipe 62b. The HF gas flows from the cleaning gas supply pipe 62b and a flow rate thereof is adjusted by the MFC 64b. The HF gas having the adjusted flow rate is supplied from the gas supply hole 48b of the nozzle 40b into the process chamber 22, comes in contact with the inner wall of the manifold 18, the top surface of the seal cap 100, the side surface of the rotary shaft 104, and the like, and is exhausted from the exhaust pipe 90. At this time, the valves 56c and 56d of the inert gas supply pipes 52c and 52d are opened, and the N₂ gas is supplied as an inert gas from the nozzle 40c. By the HF gas supplied from the nozzle 40b and the N₂ gas supplied from the nozzle 40c, as illustrated in FIG. 8b, cleaning is mainly performed on a region having a relatively low temperature such as the inner wall of the manifold 18, the top surface of the seal cap 100, the side surface of the rotary shaft 104, and the like (low-temperature region cleaning). After the HF gas is supplied from the nozzle 40b for a predetermined time, the valve 66b of the cleaning gas supply pipe 62b and the valves 56c and 56d of the inert gas supply pipes 52c and 52d are closed to suspend supply of the HF gas from the cleaning gas supply pipe 62b and supply of the N₂ gas from the inert gas supply pipes 52c and 52d.

Also, at this time, in order to prevent the HF gas from being introduced into the nozzle 40a, it is preferable that the valve 56a be opened and the N₂ gas flow into the inert gas supply pipe 52a. In this case, the N₂ gas is supplied into the process chamber 22 through the gas supply pipe 42a and the nozzle 40a and is exhausted from the exhaust pipe 90.

When cleaning is performed, the APC valve 94 is adjusted such that the pressure in the process chamber 22 is set to fall within, for example, a range of 133 Pa to 50,000 Pa. The supply flow rate of the HF gas controlled by the MFCs 64a and 64b is set to have a flow rate of, for example, a range of 1 sccm to 1,000 sccm. The temperature of the heater 14 is preferably set such that the temperature of the process chamber 22 falls within, for example, a range of 75° C. or more and less than 100° C. When the HF gas is used as the cleaning gas and the temperature is less than 75° C., the HF gas may be adsorbed in multiple layers on the surfaces of the reaction tube 16, the manifold 18, and the like. This multilayer adsorption may cause a corrosion reaction. In addition, when the temperature is 100° C. or more, the metal member may be corroded.

Instead of using only the HF gas as the cleaning gas, a gas in which the HF gas is diluted with an inert gas such as N₂ gas, Ar gas, and He gas, a mixed gas of the HF gas and fluorine (F₂) gas, a mixed gas of the HF gas and chlorine fluoride (ClF₃) gas, ClF₃ gas, and the like may also be used.

<Purging and Restoring to Atmospheric Pressure>

After the HF gas is supplied for a predetermined time and the deposition film is removed, the valves 56a, 56b, 56c, and 56d are opened, the N₂ gas is supplied as an inert gas from each of the inert gas supply pipes 52a, 52b, 52c, and 52d into the process chamber 22, and is exhausted from the exhaust pipe 90. The N₂ gas serves as a purge gas, the inside of the process chamber 22 is purged with the inert gas, and the residual gas in the process chamber 22 is removed from the inside of the process chamber 22 (purge). Then, the atmosphere in the process chamber 22 is replaced with the inert gas, and the pressure in the process chamber 22 is restored to the normal pressure (restoration to atmospheric pressure).

<Boat Unloading>

According to the same sequences as in the above-described boat unloading, the boat 28 is unloaded to the outside of the reaction tube 16. Then, the lower-end opening of the manifold 18 is sealed by the shutter 110.

Similar to the above-described Example 1, when the high-temperature region cleaning and the low-temperature region cleaning are non-simultaneously performed, that is, asynchronously performed, while the inert gas such as the N₂ gas is supplied into the reaction tube 16 through the nozzle 40a when cleaning is performed on the low-temperature region, the HF gas is preferably supplied to the inner wall surface of the manifold 18 through the nozzle 40b. At this time, more preferably, the inert gas such as the N₂ gas is supplied into the reaction tube 16 through the nozzle 40c.

In this way, by the N₂ gas supplied into the reaction tube 16, the HF gas supplied toward the inner wall surface of the manifold 18 through the nozzle 40b may be pushed downward. That is, by the N₂ gas supplied into the reaction tube 16, it is possible to suppress (block) the HF gas supplied toward the inner wall surface of the manifold 18 through the nozzle 40b from flowing and diffusing into an upper part in the reaction tube 16. Thereby, the HF gas supplied through the nozzle 40b may aggressively (intensively) come in contact with the low-temperature region such as the inner wall surface of the manifold 18, and it is possible to efficiently remove the deposition that is adhered to the low-temperature region such as the inner wall surface of the manifold 18 and is relatively difficult to remove. It is confirmed that removing the deposition adhered to the low-temperature region such as the inner wall surface of the manifold 18 is more difficult than removing the deposition adhered to the high-temperature region such as the inner wall surface of the reaction tube 16. According to regulation of flowing and diffusing of the HF gas by the N₂ gas, it is possible to efficiently remove the deposition that is adhered to the low-temperature region and is relatively difficult to remove.

In addition, unlike the low-temperature region cleaning, the HF gas is preferably supplied into the reaction tube 16 through the nozzle 40c while the inert gas such as the N₂ gas is supplied into the manifold 18 through the nozzle 40b when cleaning is performed on the high-temperature region. Thereby, the HF gas supplied into the reaction tube 16 is pressured up from the bottom, and it is possible to suppress (block) the HF gas from flowing and diffusing into the manifold 18. Accordingly, it is possible to efficiently remove the deposition adhered to the inner wall of the reaction tube 16.

Also, it is preferable that a supply concentration [a concentration of the HF gas in the nozzle 40b] of the HF gas supplied through the nozzle 40b when cleaning is performed on the low-temperature region be set higher than a supply concentration [a concentration of the HF gas in the nozzle 40c] of the HF gas supplied through the nozzle 40c when cleaning is performed on the high-temperature region. For example, the supply concentration of the HF gas supplied through the nozzle 40b is set to 80% to 100%, for example, 100%, and the supply concentration of the HF gas supplied through the nozzle 40c is set to 10% to 30%, for example, 10% to 20%. Thereby, by the high-concentration HF gas supplied through the nozzle 40b, it is possible to efficiently remove the deposition that is adhered to the low-temperature region such as the inner wall surface of the manifold 18 and is relatively difficult to remove. As described above, it is confirmed that removing the deposition adhered to the low-temperature region such as the inner wall surface of the manifold 18 is more difficult than removing the deposition adhered to the high-temperature region such as the inner wall surface of the reaction tube 16. By adjusting the concentration of the HF gas, it is possible to efficiently remove the deposition that is adhered to the low-temperature region and is relatively difficult to remove. Also, the supply concentration of the HF gas may be represented by, for example, an equation "supply flow rate of HF gas/(supply flow rate of HF gas+supply flow rate of $N_2$ gas)", and each supply concentration of HF gas may be controlled by, for example, adjusting the supply flow rate of the HF gas and the supply flow rate of the $N_2$ gas supplied into each nozzle. For example, the supply concentration of the HF gas supplied through the nozzle 40b may be controlled by adjusting the supply flow rate of the HF gas supplied into the cleaning gas supply pipe 62b and the supply flow rate of the $N_2$ gas supplied into the inert gas supply pipe 52b by the MFCs 64b and 54b, respectively. Also, for example, the supply concentration of the HF gas supplied through the nozzle 40c may be controlled by adjusting the supply flow rate of the HF gas supplied into the cleaning gas supply pipe 62a and the supply flow rate of the $N_2$ gas supplied into the inert gas supply pipes 52c and 52d by the MFCs 64a, 54c, and 54d, respectively.

As a gas supply pattern when the cleaning gas is supplied, the following Examples 2 to 5 may also be used instead of the above-described Example 1.

Cleaning Gas Supply

Example 2

In Example 2 of a cleaning gas supply pattern, the cleaning gas is supplied from the nozzle 40c and the cleaning gas is also supplied from the nozzle 40b.

Specifically, the valve 66a of the cleaning gas supply pipe 62a is opened and the HF gas flows into the cleaning gas supply pipe 62a. The HF gas flows from the cleaning gas supply pipe 62a and a flow rate thereof is adjusted by the MFC 64a. The HF gas having the adjusted flow rate is supplied from the gas supply hole 48c of the nozzle 40c into the process chamber 22, comes in contact with the inner walls of the reaction tube 16 and the manifold 18, the surface of the boat 28, and the like, and is exhausted from the exhaust pipe 90. Cleaning is mainly performed on a region having a relatively high temperature such as the inner wall of the reaction tube 16 and the surface of the boat 28 by the HF gas supplied from the nozzle 40c.

At the same time, the valve 66b of the cleaning gas supply pipe 62b is opened and the HF gas flows into the cleaning gas supply pipe 62b. The HF gas flows from the cleaning gas supply pipe 62b and a flow rate thereof is adjusted by the MFC 64b. The HF gas having the adjusted flow rate is supplied from the gas supply hole 48b of the nozzle 40b into the process chamber 22, comes in contact with the inner wall of the manifold 18, the top surface of the seal cap 100, the side surface of the rotary shaft 104, and the like, and is exhausted from the exhaust pipe 90. Cleaning is mainly performed on a region having a relatively low temperature such as the inner wall of the manifold 18, the top surface of the seal cap 100, the side surface of the rotary shaft 104, and the like by the HF gas supplied from the nozzle 40b. After the HF gas is supplied from the nozzle 40c and the nozzle 40b for a predetermined time, the valve 66a of the cleaning gas supply pipe 62a and the valve 66b of the cleaning gas supply pipe 62b are closed to suspend supply of the HF gas from the cleaning gas supply pipe 62a and the cleaning gas supply pipe 62b.

Also, at this time, in order to prevent the HF gas from being introduced into the nozzle 40a, it is preferable that the valve 56a be opened and the $N_2$ gas flow into the inert gas supply pipe 52a. In this case, the $N_2$ gas is supplied into the process chamber 22 through the gas supply pipe 42a and the nozzle 40a and is exhausted from the exhaust pipe 90.

According to Example 2, a time required for cleaning is reduced compared to that of Comparative Example 1 and is further reduced compared to that of Example 1.

Cleaning Gas Supply

Example 3

In Example 3 of a cleaning gas supply pattern, supply of the cleaning gas from the nozzle 40c and supply of the cleaning gas from the nozzle 40b are alternately performed a plurality of times.

Specifically, the valve 66a of the cleaning gas supply pipe 62a is opened and the HF gas flows into the cleaning gas supply pipe 62a. The HF gas flows from the cleaning gas supply pipe 62a and a flow rate thereof is adjusted by the MFC 64a. The HF gas having the adjusted flow rate is supplied from the gas supply hole 48c of the nozzle 40c into the process chamber 22, comes in contact with the inner walls of the reaction tube 16 and the manifold 18, the surface of the boat 28, and the like, and is exhausted from the exhaust pipe 90. At this time, the valve 56b of the inert gas supply pipe 52b is opened and the $N_2$ gas is supplied as an inert gas from the nozzle 40b. By the HF gas supplied from the nozzle 40c and the $N_2$ gas supplied from the nozzle 40b, as illustrated in FIG. 8a, cleaning is mainly performed on a region having a relatively high temperature such as the inner wall of the reaction tube 16, the surface of the boat 28, and the like (high-temperature region cleaning).

Also, at this time, in order to prevent the HF gas from being introduced into the nozzle 40a, it is preferable that the valve 56a be opened and the $N_2$ gas flow into the inert gas supply pipe 52a. In this case, the $N_2$ gas is supplied into the process chamber 22 through the gas supply pipe 42a and the nozzle 40a and is exhausted from the exhaust pipe 90.

After the HF gas is supplied from the nozzle 40c for a predetermined time (a time shorter than that of Example 1), the valve 66a of the cleaning gas supply pipe 62a and the valve 56b of the inert gas supply pipe 52b are closed to suspend supply of the HF gas from the cleaning gas supply pipe 62a and supply of the $N_2$ gas from the inert gas supply pipe 52b. Subsequently, the valve 66b of the cleaning gas supply pipe 62b is opened and the HF gas flows into the cleaning gas supply pipe 62b. The HF gas flows from the cleaning gas supply pipe 62b and a flow rate thereof is adjusted by the MFC 64b. The HF gas having the adjusted flow rate is supplied from the gas supply hole 48b of the nozzle 40b into the process chamber 22, comes in contact with the inner wall of the manifold 18, the top surface of the seal cap 100, the side surface of the rotary shaft 104, and the like, and is exhausted from the exhaust pipe 90. At this time, the valves 56c and 56d of the inert gas supply pipes 52c and 52d are opened, and the $N_2$ gas is supplied as an inert gas from the nozzle 40c. By the HF gas supplied from the nozzle 40b and the N₂ gas supplied from the nozzle 40c, as illustrated in FIG. 8b, cleaning is mainly performed on a region having a relatively low temperature such as the inner wall of the manifold 18, the top surface of the seal cap 100, the side surface of the rotary shaft 104, and the like (low-temperature region cleaning). After the HF gas is supplied from the nozzle 40b for a predetermined time (a time shorter than that of Example 1), the valve 66b of the cleaning gas supply pipe 62b and the valves 56c and 56d of the inert gas supply pipes 52c and 52d are closed to suspend supply of the HF gas from the cleaning gas supply pipe 62b and supply of the N₂ gas from the inert gas supply pipes 52c and 52d.

Also, at this time, in order to prevent the HF gas from being introduced into the nozzle 40a, it is preferable that the valve 56a be opened and the N₂ gas flow into the inert gas supply pipe 52a. In this case, the N₂ gas is supplied into the process chamber 22 through the gas supply pipe 42a and the nozzle 40a and is exhausted from the exhaust pipe 90.

Supply of the HF gas from the nozzle 40c and supply of the N₂ gas from the nozzle 40b, and supply of the HF gas from the nozzle 40b and supply of the N₂ gas from the nozzle 40c are alternately performed a plurality of times. That is, the high-temperature region cleaning and the low-temperature region cleaning are alternately repeatedly performed.

According to Example 3, a time required for cleaning is reduced compared to that of Comparative Example 1 as much as in Example 1. Also, when the high-temperature region cleaning and the low-temperature region cleaning is set as one cycle, according to the number of times the cycle is performed, it is possible to control a removal amount (etching amount) of the deposition respectively adhered to the high-temperature region and the low-temperature region Cleaning Gas Supply Example 4

In Example 4 of a cleaning gas supply pattern, while the cleaning gas is continuously supplied from the nozzle 40b, the cleaning gas is intermittently supplied from the nozzle 40c.

Specifically, the valve 66b of the cleaning gas supply pipe 62b is opened and the HF gas flows into the cleaning gas supply pipe 62b. The HF gas flows from the cleaning gas supply pipe 62b and a flow rate thereof is adjusted by the MFC 64b. The HF gas having the adjusted flow rate 22 is supplied from the gas supply hole 48b of the nozzle 40b into the process chamber 22, comes in contact with the inner wall of the manifold 18, the top surface of the seal cap 100, the side surface of the rotary shaft 104, and the like, and is exhausted from the exhaust pipe 90. Cleaning is mainly performed on a region having a relatively low temperature such as the inner wall of the manifold 18, the top surface of the seal cap 100, the side surface of the rotary shaft 104, and the like by the HF gas supplied from the nozzle 40b.

To this end, the valve 66a of the cleaning gas supply pipe 62a is opened and the HF gas flows into the cleaning gas supply pipe 62a. The HF gas flows from the cleaning gas supply pipe 62a and a flow rate thereof is adjusted by the MFC 64a. The HF gas having the adjusted flow rate is supplied from the gas supply hole 48c of the nozzle 40c into the process chamber 22, comes in contact with the inner walls of the reaction tube 16 and the manifold 18, the surface of the boat 28, and the like, and is exhausted from the exhaust pipe 90. Cleaning is mainly performed on a region having a relatively high temperature such as the inner wall of the reaction tube 16, the surface of the boat 28, and the like by the HF gas supplied from the nozzle 40c. After the HF gas is supplied from the nozzle 40c for a predetermined time (a time shorter than that of Example 1), the valve 66a of the cleaning gas supply pipe 62a is closed to suspend supply of the HF gas from the cleaning gas supply pipe 62a. Subsequently, after a predetermined time [for example, a time for which the valve 66a is opened] passes, the valve 66a of the cleaning gas supply pipe 62a is opened again, and the HF gas flows into the cleaning gas supply pipe 62a. By repeating this manipulation, the HF gas is intermittently supplied from the nozzle 40c.

According to Example 4, a time required for cleaning is reduced compared to that of Comparative Example 1 and is further reduced compared to that of Example 1. Also, since a time for contacting the HF gas with the region having a relatively low temperature may be set to be greater than a time for contacting the HF gas with the region having a relatively high temperature, it is possible to intensively perform cleaning on the region having a relatively low temperature.

Cleaning Gas Supply

Example 5

In Example 5 of a cleaning gas supply pattern, while the cleaning gas is continuously supplied from the nozzle 40c, the cleaning gas is intermittently supplied from the nozzle 40b.

Specifically, the valve 66a of the cleaning gas supply pipe 62a is opened and the HF gas flows into the cleaning gas supply pipe 62a. The HF gas flows from the cleaning gas supply pipe 62a and a flow rate thereof is adjusted by the MFC 64a. The HF gas having the adjusted flow rate is supplied from the gas supply hole 48c of the nozzle 40c into the process chamber 22, comes in contact with the inner walls of the reaction tube 16 and the manifold 18, the surface of the boat 28, and the like, and is exhausted from the exhaust pipe 90. Cleaning is mainly performed on a region having a relatively high temperature such as the inner wall of the reaction tube 16 and the surface of the boat 28 by the HF gas supplied from the nozzle 40c.

To this end, the valve 66b of the cleaning gas supply pipe 62b is opened and the HF gas flows into the cleaning gas supply pipe 62b. The HF gas flows from the cleaning gas supply pipe 62b and a flow rate thereof is adjusted by the MFC 64b. The HF gas having the adjusted flow rate 22 is supplied from the gas supply hole 48b of the nozzle 40b into the process chamber 22, comes in contact with the inner wall of the manifold 18, the top surface of the seal cap 100, the side surface of the rotary shaft 104, and the like, and is exhausted from the exhaust pipe 90. Cleaning is mainly performed on a region having a relatively low temperature such as the inner wall of the manifold 18, the top surface of the seal cap 100, the side surface of the rotary shaft 104, and the like by the HF gas supplied from the nozzle 40b. After the HF gas is supplied from the nozzle 40b for a predetermined time (a time shorter than that of Example 1), the valve 66b of the cleaning gas supply pipe 62b is closed to suspend supply of the HF gas from the cleaning gas supply pipe 62b. Subsequently, after a predetermined time [for example, a time for which the valve 66b is opened] passes, the valve 66b of the cleaning gas supply pipe 62b is opened again, and the HF gas flows into the cleaning gas supply pipe 62b. By repeating this manipulation, the HF gas is intermittently supplied from the nozzle 40b.

According to Example 5, a time required for cleaning is reduced compared to that of Comparative Example 1, is further reduced compared to that of Example 1, and is equally reduced as in Example 4.

Second Embodiment

Next, the second embodiment will be described. In the first embodiment, the L-shaped nozzle 40b including the gas supply hole 48b opened upward is connected to the cleaning gas supply pipe 62b. In the second embodiment, the nozzle 320b is connected to the cleaning gas supply pipe 62b. This is a difference between the two embodiments. In the present embodiment, the same numerals are assigned to substantially the same components as those in the first embodiment and descriptions thereof will not be repeated.

Figure 9:
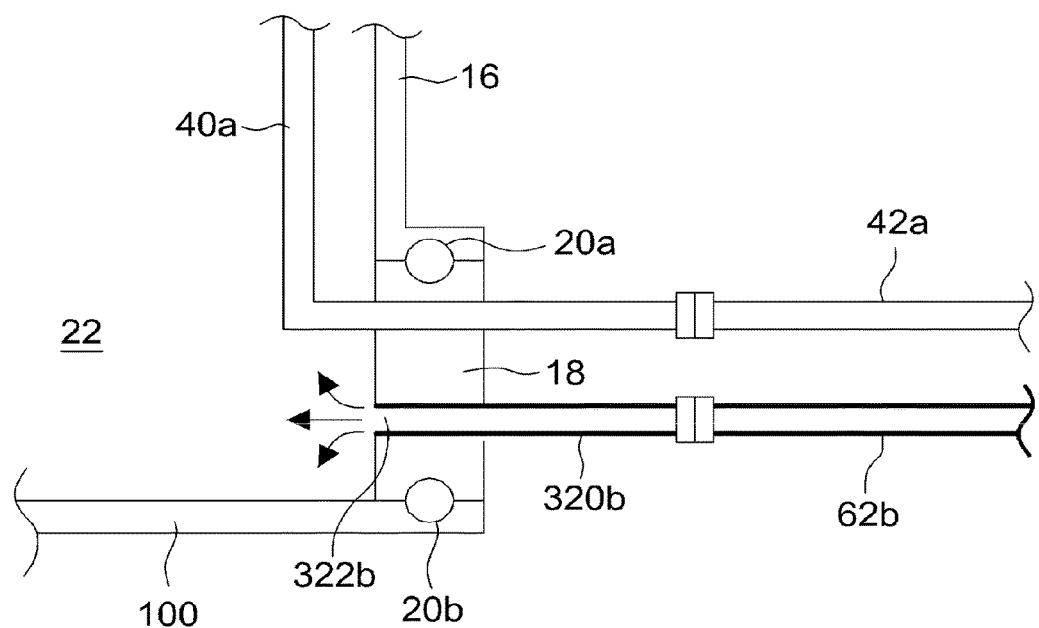
FIG. 9 is an enlarged partial cross-sectional view illustrating a periphery of a nozzle 320*b* in a second embodiment of the vertical processing furnace of the substrate processing apparatus preferably used in the embodiment of the present invention.

As illustrated in FIG. 9, the nozzle 320b has an I shape [short pipe shape], and a main body portion is provided to penetrate a sidewall of the manifold 18 such that a leading end thereof is substantially flush with the inner wall of the manifold 18. Also, the leading end of the nozzle 320b may be projected from the inner wall of the manifold 18.

A gas supply hole 322b configured to supply a gas is provided in the leading end of the nozzle 320b. The gas supply hole 322b is configured to be opened [opened to a direction from the inner wall side of the manifold 18 to the inner side] toward a side (horizontal direction). The nozzle 320b is configured to supply a gas to the inner side in the process chamber 20 from the manifold 18 side relative to a position in which the nozzle 40a supplies a gas. In addition, the nozzle 320b is able to supply a gas to the inner wall surface of the manifold 18.

Third Embodiment

Next, the third embodiment will be described. In the first embodiment, the nozzle 40b including the gas supply hole 48b opened upward is connected to the cleaning gas supply pipe 62b. In the third embodiment, a nozzle 330b is connected to the cleaning gas supply pipe 62b. This is a difference between the two embodiments. In the present embodiment, the same numerals are assigned to substantially the same components as those in the first embodiment and descriptions thereof will not be repeated.

Figure 10:
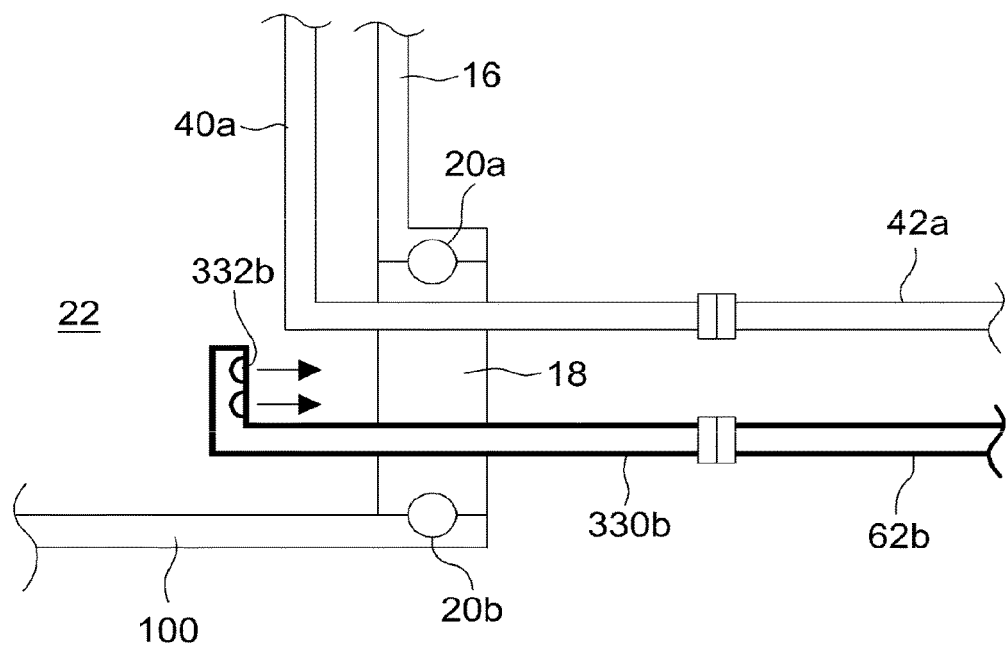
FIG. 10 is an enlarged partial cross-sectional view illustrating a periphery of a nozzle 330*b* in a third embodiment of the vertical processing furnace of the substrate processing apparatus preferably used in the embodiment of the present invention.

As illustrated in FIG. 10, the nozzle 330b is an L-shaped short nozzle, and is provided such that a horizontal portion thereof penetrates a sidewall of the manifold 18 and a vertical portion thereof extends upward along an inner wall of the manifold 18.

A gas supply hole 332b is provided in the sidewall of the manifold 18 side of the vertical portion of the nozzle 330b, and the gas supply hole 332b is configured to be opened toward the inner wall surface of the manifold 18. That is, the gas supply hole 332b is provided so as to face (oppose) the inner wall surface of the manifold 18. The nozzle 330b is configured to directly supply a gas from the manifold 18 side to the inner wall side of the manifold 18 relative to a position in which the nozzle 40a supplies a gas.

Fourth Embodiment

Next, the fourth embodiment will be described. In the first embodiment, the nozzle 40b including the gas supply hole 48b opened upward is connected to the cleaning gas supply pipe 62b. In the fourth embodiment, a nozzle 340b is connected to the cleaning gas supply pipe 62b. This is a difference between the two embodiments. In the present embodiment, the same numerals are assigned to substantially the same components as those in the first embodiment and descriptions thereof will not be repeated.

Figure 11:
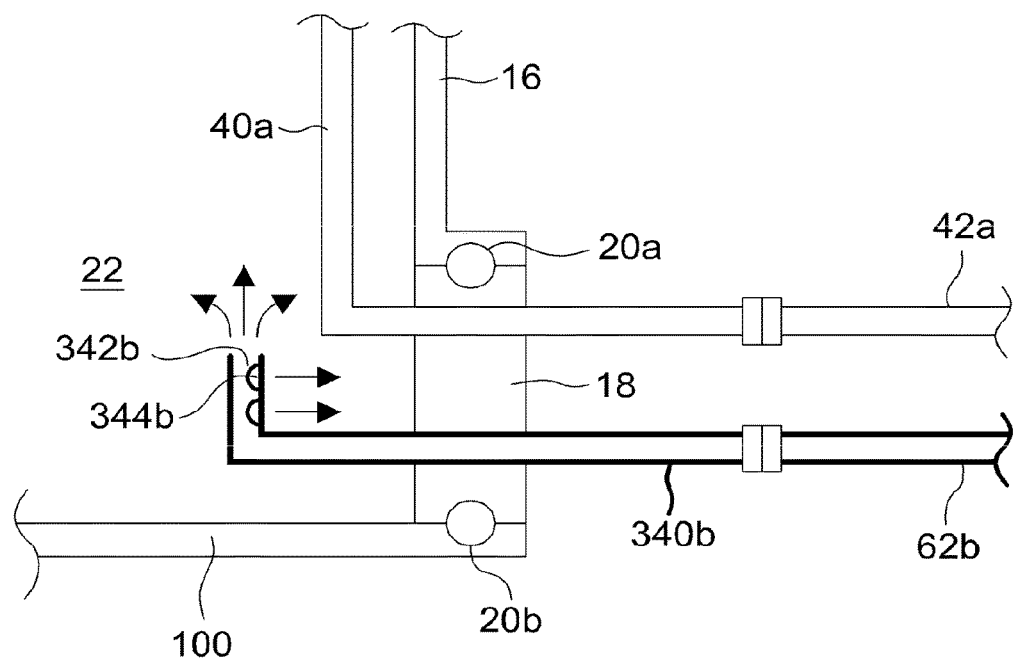
FIG. 11 is an enlarged partial cross-sectional view illustrating a periphery of a nozzle 340*b* in a fourth embodiment of the vertical processing furnace of the substrate processing apparatus preferably used in the embodiment of the present invention.

As illustrated in FIG. 11, the nozzle 340b is an L-shaped short nozzle, and is provided such that a horizontal portion thereof penetrates a sidewall of the manifold 18 and a vertical portion thereof extends upward along an inner wall of the manifold 18.

A gas supply hole 342b configured to supply a gas is provided in a leading end of the nozzle 340b, and the gas supply hole 342b is opened upward [opened in a direction from the manifold 18 side to the reaction tube 16 side]. Also, a gas supply hole 344b is provided in a sidewall of the manifold 18 side of the vertical portion of the nozzle 340b. The gas supply hole 344b is configured to be opened toward the inner wall surface of the manifold 18. The nozzle 340b is configured to supply a gas to the upper part in the process chamber 20 and the inner wall side of the manifold 18 from the manifold 18 side relative to a position in which the nozzle 40a supplies a gas. The nozzle 340b is able to directly supply a gas toward the inner wall surface of the manifold 18.

Fifth Embodiment

Next, the fifth embodiment will be described. In the first embodiment, the nozzle 40b including the gas supply hole 48b opened upward is connected to the cleaning gas supply pipe 62b. In the fifth embodiment, a nozzle 350b is connected to the cleaning gas supply pipe 62b. This is a difference between the two embodiments. In the present embodiment, the same numerals are assigned to substantially the same components as those in the first embodiment and descriptions thereof will not be repeated.

Figure 12:
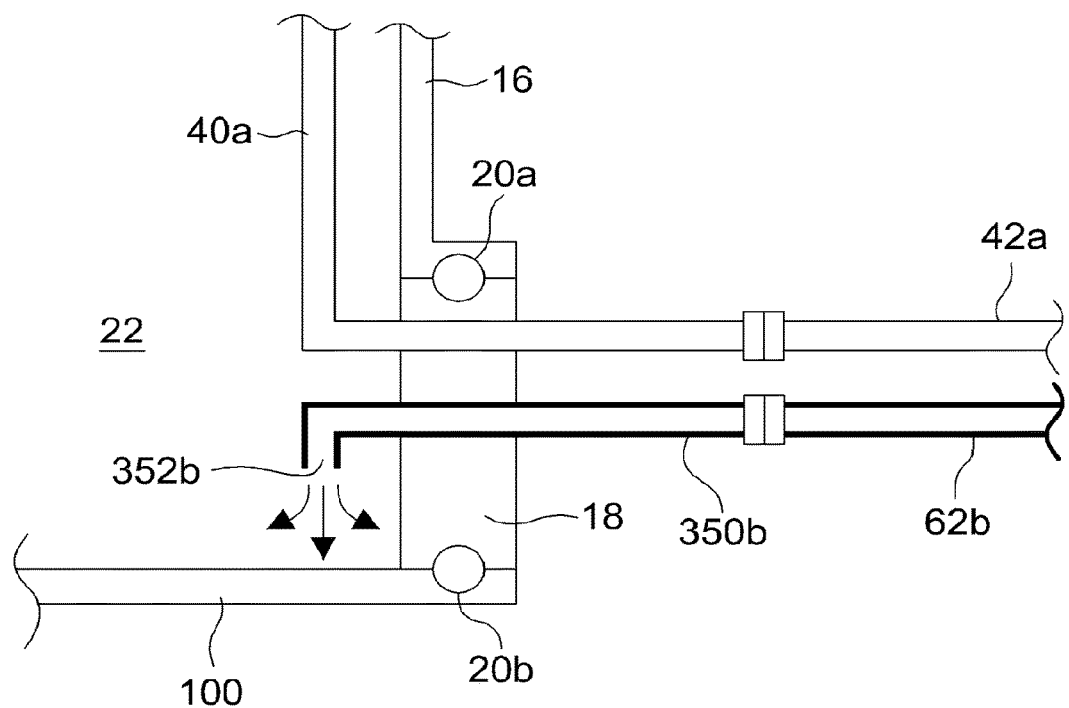
FIG. 12 is an enlarged partial cross-sectional view illustrating a periphery of a nozzle 350*b* in a fifth embodiment of the vertical processing furnace of the substrate processing apparatus preferably used in the embodiment of the present invention.

As illustrated in FIG. 12, the nozzle 350b is an L-shaped short nozzle, and is provided such that a horizontal portion thereof penetrates a sidewall of the manifold 18 and a vertical portion thereof extends downward along an inner wall of the manifold 18.

A gas supply hole 352b configured to supply a gas is provided in a leading end of the nozzle 350b, and the gas supply hole 352b is opened downward [opened in a direction from the manifold 18 side to the seal cap 100 side]. That is, the gas supply hole 352b is provided so as to face (oppose) the seal cap 100. The nozzle 350b is configured to supply a gas to the lower part in the process chamber 20 from the manifold 18 side relative to a position in which the nozzle 40a supplies a gas. The nozzle 350b is able to directly supply a gas toward the top surface of the seal cap 100.

Sixth Embodiment

Next, the sixth embodiment will be described. In the first embodiment, the nozzle 40b including the gas supply hole 48b opened upward is connected to the cleaning gas supply pipe 62b. In the sixth embodiment, a nozzle 360b is connected to the cleaning gas supply pipe 62b. This is a difference between the two embodiments. In the present embodiment, the same numerals are assigned to substantially the same components as those in the first embodiment and descriptions thereof will not be repeated.

Figure 13:
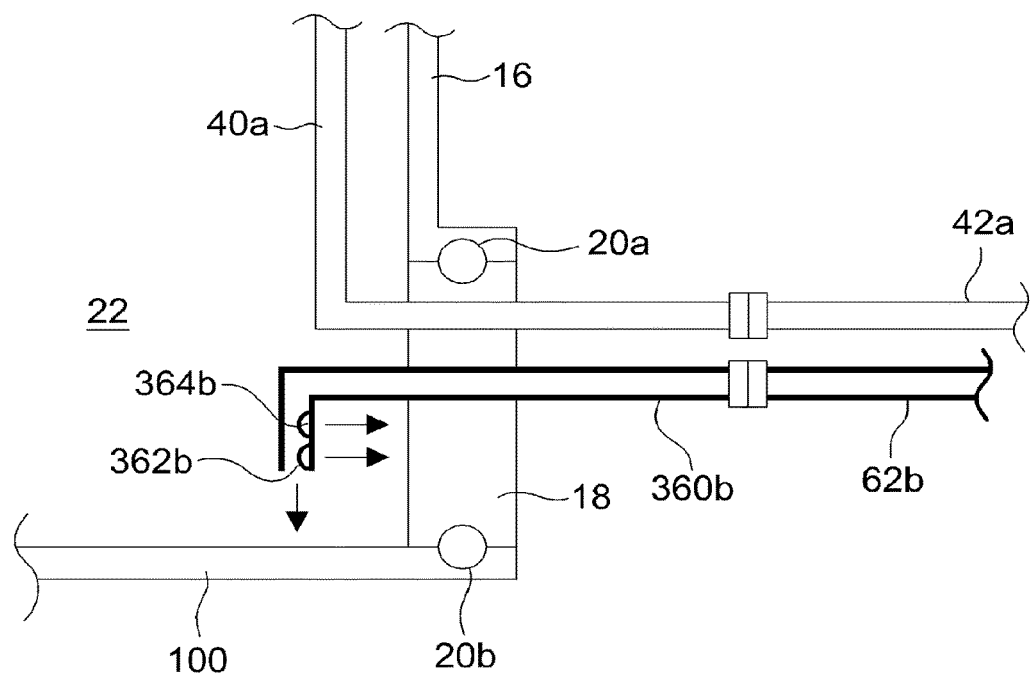
FIG. 13 is an enlarged partial cross-sectional view illustrating a periphery of a nozzle 360*b* in a sixth embodiment of the vertical processing furnace of the substrate processing apparatus preferably used in the embodiment of the present invention.

As illustrated in FIG. 13, the nozzle 360b is an L-shaped short nozzle, and is provided such that a horizontal portion thereof penetrates a sidewall of the manifold 18 and a vertical portion thereof extends downward along an inner wall of the manifold 18.

A gas supply hole 362b configured to supply a gas is provided in a leading end of the nozzle 360b, and the gas supply hole 362b is opened downward [opened in a direction from the manifold 18 side to the seal cap 100 side]. That is, the gas supply hole 362b is provided so as to face (oppose) the seal cap 100. Also, a gas supply hole 364b is provided in a sidewall of the manifold 18 side of the vertical portion of the nozzle 360b. The gas supply hole 364b is configured to be opened toward the inner wall surface of the manifold 18. That is, the gas supply hole 364b is provided so as to face (oppose) the manifold 18. The nozzle 360b is configured to supply a gas to the lower part in the process chamber 20 and the inner wall side of the manifold 18 from the manifold 18 side relative to a position in which the nozzle 40a supplies a gas. The nozzle 360b is able to directly supply a gas toward the top surface of the seal cap 100 and the inner wall surface of the manifold.

Seventh Embodiment

Figure 14:
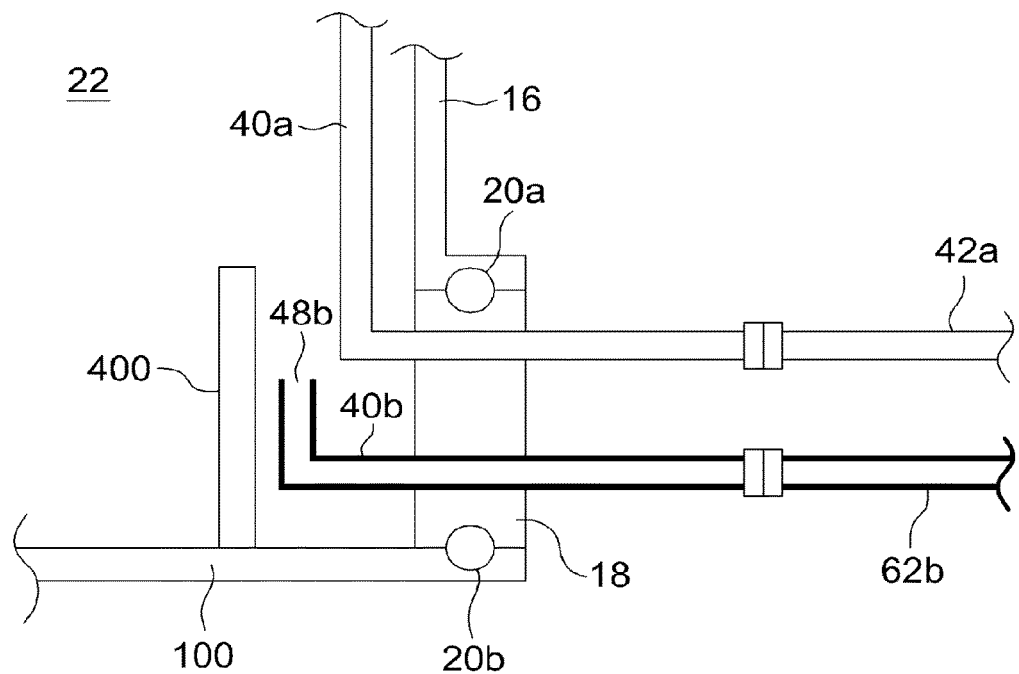
FIG. 14 is an enlarged partial cross-sectional view illustrating a periphery of a nozzle 40*b* in a seventh embodiment of the vertical processing furnace of the substrate processing apparatus preferably used in the embodiment of the present invention.

Next, the seventh embodiment will be described. In the seventh embodiment, a cover 400 covering the inner wall surface is provided in the inner wall surface of the manifold 18 side of the first embodiment. As illustrated in FIG. 14, the cover 400 is provided on the top surface of the seal cap 100, and made of, for example, a heat-resistant material (nonmetallic material) such as quartz and SiC. The gas supply hole 48b of the nozzle 40b is disposed in a gap between the cover 400 and the manifold 18, and the HF gas flows between the cover 400 and the manifold 18.

It is preferable that the cover 400 be provided concentrically with the manifold 18 in the inner side of the manifold 18. That is, it is preferable that the cover 400 be provided to cover the entire inner wall surface of the manifold 18 so as to face (oppose) the inner wall surface of the manifold 18. In such a configuration, since the HF gas comes in contact with the inner wall surface of the manifold 18 more aggressively (intensively), it is possible to efficiently remove the deposition that is adhered to the inner wall surface of the manifold 18 and is relatively difficult to remove. The cover 400 serves as a guide portion, which allows the HF gas to aggressively flow along the inner wall surface of the manifold 18, that is, a gas flow regulating portion (gas flow regulating unit).

Eighth Embodiment

Figure 15:
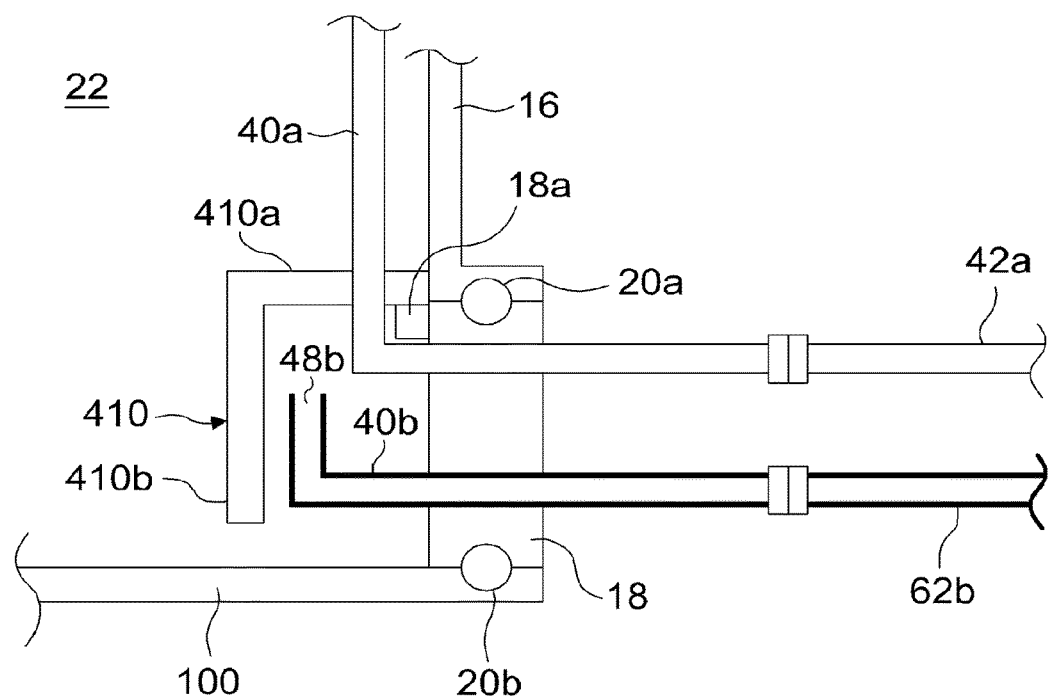
FIG. 15 is an enlarged partial cross-sectional view illustrating a periphery of a nozzle 40*b* in an eighth embodiment of the vertical processing furnace of the substrate processing apparatus preferably used in the embodiment of the present invention.

Next, the eighth embodiment will be described. In the eighth embodiment, similar to the seventh embodiment, a cover 410 covering the inner wall surface is provided in the inner wall side of the manifold 18 of the first embodiment. As illustrated in FIG. 15, the cover 410 includes a top surface portion 410a and a side surface portion 410b. The top surface portion 410a is configured to horizontally extend from an upper end of the side surface portion 410b to the outside [the manifold 18 side]. The top surface portion 410a is also called an extending portion. Since the side surface portion 410b vertically extends [is suspended] from an end of the top surface portion 410a to a lower part, it is also called a suspended portion. A protrusion 18a horizontally projecting toward the inner side of the manifold 18 is provided in an upper end of the inner wall of the manifold 18. The top surface portion 410a of the cover 410 is supported by the protrusion 18a. The protrusion 18a serves as a support portion supporting the cover 410. The cover 410 is provided such that a lower part thereof is opened, and is made of, for example, a heat-resistant material (nonmetallic material) such as quartz and SiC. The gas supply hole 48b of the nozzle 40b is disposed in a gap between the cover 410 and the manifold 18, and the HF gas flows between the cover 410 and the manifold 18.

It is preferable that the cover 410 be provided concentrically with the manifold 18 in the inner side of the manifold 18. That is, it is preferable that the cover 410 be provided to cover substantially the entire inner wall surface of the manifold 18 so as to face (oppose) the inner wall surface of the manifold 18. In such a configuration, since the HF gas comes in contact with the inner wall surface of the manifold 18 more aggressively (intensively), it is possible to efficiently remove the deposition that is adhered to the inner wall surface of the manifold 18 and is relatively difficult to remove. The cover 410 serves as a guide portion, which allows the HF gas to aggressively flow along the inner wall surface of the manifold 18, that is, a gas flow regulating portion (gas flow regulating unit).

Even in such a configuration, since the HF gas comes in contact with the inner wall surface of the manifold 18 more aggressively (intensively), it is possible to efficiently remove the deposition that is adhered to the inner wall surface of the manifold 18 and is relatively difficult to remove.

Also, the top surface portion 410a of the cover 410 may be provided between the reaction tube 16 and the manifold 18. In this case, since there is no need to provide the protrusion 18a in the manifold 18, it is possible to simplify a shape of the manifold 18, thereby reducing a processing cost of the manifold 18, that is, a manufacturing cost of the substrate processing apparatus. In addition, the top surface of the cover 410 may be opened by providing an opening such as a slit and a hole in the top surface portion 410a of the cover 410 and the top surface of the cover 410. Also, an upper part may be opened by reversing the cover 410 upside down.

Also, the covers 400 and 410 and each nozzle of the first to sixth embodiments may be appropriately combined.

In the above-described first to eighth embodiments, while a case in which the substrate processing apparatus 10 having no plasma source has been described, the present invention is not limited thereto but the plasma source may be used. However, when the plasma source is not included, it is possible to simplify a structure of the substrate processing apparatus compared to when the plasma source is included. Therefore, it is possible to reduce a manufacturing cost of the substrate processing apparatus.

In the above embodiment, the HF gas is not supplied from the nozzle 40a. While deposition having SiO as a main component is adhered to the member in the process chamber 20 in the process of forming the SiO film, deposition having Si as a main component is adhered to the inside of the nozzle 40a, that is, the inner wall of the nozzle 40a, since only HCDS gas flows into the nozzle 40a. However, it is difficult to remove the deposition having Si as a main component using the HF gas. Therefore, in the cleaning process, even when the HF gas flows into the nozzle 40a, it is difficult to remove the deposition having Si as a main component adhered to the inner wall of the nozzle 40a.

Also, when the HF gas flows into the nozzle 40a, the HF gas may be introduced into a gap between the deposition having Si as a main component adhered to the inner wall of the nozzle 40a and the inner wall of the nozzle 40a. Thereby, an interface between the inner wall of the nozzle 40a and the deposition having Si as a main component may become unstable. When the process of forming the SiO film is performed in this state, the deposition having Si as a main component adhered to the inner wall of the nozzle 40*a* is partially released therefrom during the film-forming, and thereby a foreign material may be generated and adhered to the wafer 24.

Therefore, in the present embodiment, the HF gas is not supplied into the reaction tube 16 through the nozzle 40*a* in the cleaning process and the HF gas is supplied into the reaction tube 16 through the nozzle 40*c*. That is, supply of the HF gas into the reaction tube 16 through the nozzle 40*a* is not performed.

When the HF gas is supplied into the reaction tube 16 through the nozzle 40*c*, in order to prevent the HF gas from being introduced into the nozzle 40*a*, it is preferable that an inert gas such as the $N_2$ gas be supplied into the nozzle 40*a*. That is, it is preferable that the valve 56*a* of the inert gas supply pipe 52*a* be opened and the $N_2$ gas as an inert gas be supplied from the inert gas supply pipe 52*a*. Thereby, it is possible to prevent the foreign material from being generated due to an unstable interface between the inner wall of the nozzle 40*a* and the deposition having Si as a main component.

Also, there is no need to clean the inside of the nozzle 40*a*, that is, to remove the deposition having Si as a main component adhered to the inner wall of the nozzle 40*a*. The nozzle 40*a* may be exchanged when an accumulated film has a predetermined thickness of, for example, 4 μm to 5 μm, that is a thickness before the foreign material is generated after a release occurs in the deposition.

Also, in the present embodiment, even when the HF gas is supplied toward the inner wall surface of the manifold 18 through the nozzle 40*b*, the HF gas may not be supplied into the reaction tube 16 through the nozzle 40*a*.

Even when the HF gas is supplied toward the inner wall surface of the manifold 18 through the nozzle 40*b*, in order to prevent the HF gas from being introduced into the nozzle 40*a*, it is preferable that an inert gas such as the $N_2$ gas be supplied into the nozzle 40*a*. Thereby, it is possible to prevent the foreign material from being generated due to an unstable interface between the inner wall of the nozzle 40*a* and the deposition having Si as a main component. At this time, it is preferable that the HF gas be prevented from being introduced into the nozzle 40*c* by supplying the inert gas such as the $N_2$ gas into the nozzle 40*c*.

In addition, in the process of forming the SiO film, since only the $O_2$ gas or the $H_2$ gas flows into the nozzle 40*c*, no deposition is adhered to the inside of the nozzle 40*c*, that is, the inner wall of the nozzle 40*c*, or even when the deposition is adhered thereto, it is caused by a small amount of the HCDS gas introduced into the nozzle 40*c*, and thereby only a small amount of the deposition is adhered thereto. As a result, there is no need to clean the inside of the nozzle 40*c*.

Also, in the above embodiment, while a configuration in which the $O_2$ gas and the $H_2$ gas are supplied through the same nozzle [the nozzle 40*c*] into the process chamber 22 has been described, the present invention is not limited thereto and each gas may also be supplied into the process chamber 22 from a separate nozzle. However, when a plurality of types of gases use a common nozzle, it is advantageous in that the number of nozzles decreases, a device cost decreases, and maintenance becomes easier, compared to when separate nozzles are provided. The nozzle for supplying the HCDS gas and the nozzle for supplying the $H_2$ gas may share a nozzle and the gases may be supplied through the same nozzle. This is because, under the above-described processing conditions, when the $H_2$ gas and the HCDS gas adhered to the inside of the nozzle come in contact, there is no film-forming reaction. In addition, it is preferable that the nozzle for supplying the HCDS gas and the nozzle for supplying the $O_2$ gas be separately provided. This is because, according to temperature conditions, when the $O_2$ gas and the HCDS gas adhered to the inside of the nozzle come in contact, the film-forming reaction is generated and the thick deposition may be formed.

In the above embodiment, while the example in which the chlorosilane-based source gas is used as a source gas when the Si-containing layer is formed in step 1 has been described, instead of the chlorosilane-based source gas, a fluorosilane-based material gas or a silane-based material gas having a halogen-based ligand other than a chloro group may also be used.

The fluorosilane-based material gas refers to a fluorosilane-based material in a gas state, for example, a gas obtained by vaporizing a fluorosilane-based material that is in a liquid state under normal temperature and normal pressure, or a fluorosilane-based material that is in a gas state under normal temperature and normal pressure. In addition, the fluorosilane-based material refers to a silane-based material having a fluoro group as a halogen group, and a source including at least silicon (Si) and fluorine (F). That is, the fluorosilane-based material may also be a kind of halide.

As the fluorosilane-based material gas, a silicon fluoride gas such as tetrafluorosilane [silicon tetrafluoride ($SiF_4$)] gas and hexafluorodisilane ($Si_2F_6$) gas may be used. In this case, when the Si-containing layer is formed, the fluorosilane-based material gas is supplied to the wafer 24 in the process chamber 22. The Si-containing layer formed in this way includes either or both of the adsorption layer of the fluorosilane-based material gas and the Si layer.

In the above embodiment, while the example in which, in step 3 of the process of forming the SiO film, the $O_2$ gas and the $H_2$ gas are supplied into the process chamber 22 that is heated under sub-atmospheric pressure, and the Si-containing layer is changed to the SiO layer has been described, the present invention is not limited thereto. In step 3, the $H_2$ gas is not supplied and only the oxygen-containing gas such as $O_2$ gas, $O_3$ gas, and $H_2O$ gas may be supplied. In addition, these oxygen-containing gases may also be supplied by being activated as plasma.

In the above embodiment, while the example in which the HCDS gas, the $O_2$ gas and the $H_2$ gas are alternately supplied into the process chamber 22 to from the SiO film on the wafer 24 has been described, the present invention is not limited thereto. Alternatively, the HCDS gas and the oxygen-containing gas such as the $O_2$ gas, the $O_3$ gas, and the $H_2O$ gas may be simultaneously supplied into the process chamber 22 to form the SiO film on the wafer 24.

In the above embodiment, while the example in which the silicon-based thin film including silicon, that is a semiconductor element, is formed as a thin film, has been described, the present invention is not limited thereto. The present invention may also be preferably applied when a metal-based thin film containing a metal element such as titanium (Ti), zirconium (Zr), hafnium (Hf), tantalum (Ta), aluminum (Al), and molybdenum (Mo) is formed as a thin film.

As a metal-based thin film containing Ti, when a titanium oxide film (TiO film) is formed, as a source gas, for example, a gas which contains Ti and a chloro group such as titanium tetrachloride ($TiCl_4$) or a gas which contains Ti and a fluoro group such as titanium tetrafluoride ($TiF_4$) may be used. As an oxygen-containing gas and a hydrogen-containing gas, the same gases as in the above-described embodiment may be used. Processing conditions may be the same, for example, as in the above-described embodiment.

As a metal-based thin film containing Zr, when a zirconium oxide film (ZrO film) is formed, as a source gas, for example, a gas which contains Zr and a chloro group such as zirconium tetrachloride ($ZrCl_4$) or a gas which contains Zr and a fluoro group such as zirconium tetrafluoride ($ZrF_4$) may be used. As an oxygen-containing gas and a hydrogen-containing gas, the same gases as in the above-described embodiment may be used. Processing conditions may be the same, for example, as in the above-described embodiment.

As a metal-based thin film containing Hf, when a hafnium oxide film (HfO film) is formed, as a source gas, for example, a gas which contains Hf and a chloro group such as hafnium tetrachloride ($HfCl_4$) or a gas which contains Hf and a fluoro group such as hafnium tetrafluoride ($HfF_4$) may be used. As an oxygen-containing gas and a hydrogen-containing gas, the same gases as in the above-described embodiment may be used. Processing conditions may be the same, for example, as in the above-described embodiment.

As a metal-based thin film containing Ta, when a tantalum oxide film (TaO film) is formed, as a source gas, for example, a gas which contains Ta and a chloro group such as tantalum pentachloride ($TaCl_5$) or a gas which contains Ta and a fluoro group such as tantalum pentafluoride ($TaF_5$) may be used. As an oxygen-containing gas and a hydrogen-containing gas, the same gases as in the above-described embodiment may be used. Processing conditions may be the same, for example, as in the above-described embodiment.

As a metal-based thin film containing Al, when an aluminum oxide film (AlO film) is formed, as a source gas, for example, a gas which contains Al and a chloro group such as aluminum trichloride ($AlCl_3$) or a gas which contains Al and a fluoro group such as aluminum trifluoride ($AlF_3$) may be used. As an oxygen-containing gas and a hydrogen-containing gas, the same gases as in the above-described embodiment may be used. Processing conditions may be the same, for example, as in the above-described embodiment.

As a metal-based thin film containing Mo, when a molybdenum oxide film (MoO film) is formed, as a source gas, for example, a gas which contains Mo and a chloro group such as molybdenum pentachloride ($MoCl_5$) or a gas which contains Mo and a fluoro group such as molybdenum pentafluoride ($MoF_5$) may be used. As an oxygen-containing gas and a hydrogen-containing gas, the same gases as in the above-described embodiment may be used. Processing conditions may be the same, for example, as in the above-described embodiment.

In this way, the present invention is applied to form the silicon-based thin film and is also applied to form the metal-based thin film. In this case, the same action effects as in the above-described embodiment may be obtained. That is, the present invention may be preferably applied when a thin film including a predetermined element such as a semiconductor element and a metal element is formed.

In the above embodiment, while the case in which, in the cleaning process, after the boat is loaded, the cleaning gas is supplied into the process chamber 20 [cleaning the inside of the process chamber 20 is performed while the boat 28 is accommodated in the process chamber 20] has been described, the present invention is not limited thereto. When cleaning of the boat 28 is unnecessary, the boat loading may be skipped [while the boat 28 is not accommodated in the process chamber 20] and the cleaning gas may also be supplied into the process chamber 20.

In the above embodiment, while the example in which a thin film is formed using the batch-type substrate processing apparatus that processes a plurality of substrates at once has been described, the present invention is not limited thereto but may also be preferably applied when a thin film is formed using a single wafer type substrate processing apparatus that processes a single substrate or several substrates at once.

In the above embodiment, while the example in which the substrate processing apparatus including a hot wall-type processing furnace is used to form a thin film has been described, the present invention is not limited thereto but may also be preferably applied to when a substrate processing apparatus including a cold wall-type processing furnace is used to form a thin film.

The first to eighth embodiments, each of Examples, and the like may be appropriately combined and used.

In any of the first to eighth embodiments, when Example 2 of a cleaning gas supply pattern is applied, in any embodiment, the process of supplying the cleaning gas into the reaction tube 16 and the process of supplying the cleaning gas toward the inner wall surface of the manifold 18 are simultaneously performed. In particular, in the third, fourth, and sixth to eighth embodiments, when Example 2 of a cleaning gas supply pattern is applied, the process of supplying the cleaning gas into the reaction tube 16 and the process of directly supplying the cleaning gas toward the inner wall surface of the manifold 18 or the top surface of the seal cap 100 are simultaneously performed.

In any of the third, fourth, and sixth to eighth embodiments, when Example 3 of a cleaning gas supply pattern is applied, the process of supplying the cleaning gas into the reaction tube 16 and the process of directly supplying the cleaning gas toward the inner wall surface of the manifold 18 or the top surface of the seal cap 100 are alternately repeatedly performed.

In any of the third, fourth, and sixth to eighth embodiments, when any of Examples 3 to 5 of a cleaning gas supply pattern is applied, at least one of the process of supplying the cleaning gas into the reaction tube 16 and the process of directly supplying the cleaning gas toward the inner wall surface of the manifold 18 or the top surface of the seal cap 100 is intermittently performed.

In any of the third, fourth, and sixth to eighth embodiments, when Example 4 or 5 of a cleaning gas supply pattern is applied, either the process of supplying the cleaning gas into the reaction tube 16 or the process of directly supplying the cleaning gas toward the inner wall surface of the manifold 18 or the top surface of the seal cap 100 is intermittently performed, and the other process is continuously performed.

The present invention may also be implemented by changing, for example, a process recipe or a cleaning recipe of a predetermined substrate processing apparatus. When the process recipe or the cleaning recipe is changed, the process recipe or the cleaning recipe according to the present invention is installed in the predetermined substrate processing apparatus through telecommunication lines or a recording medium storing the process recipe or the cleaning recipe, or the process recipe or the cleaning recipe is directly changed to a process recipe or a cleaning recipe according to the present invention by manipulating an input and output device of the predetermined substrate processing apparatus.

According to the present invention, it is possible to reduce a time required for cleaning.

Preferred Embodiments of the Present Invention

Hereinafter, preferred embodiments of the present invention are added.

(Supplementary Note 1)

According to an embodiment of the present invention, there is provided a cleaning method, including:

(a) providing a process chamber after forming an oxide film on a substrate in the process chamber formed by a reaction tube and a manifold supporting the reaction tube by performing a cycle a predetermined number of times, the cycle including supplying a source gas to the substrate in the process chamber through a first nozzle disposed in the manifold and extending upward from the manifold to an inside of the reaction tube, and supplying an oxidizing gas to the substrate in the process chamber through a second nozzle disposed in the manifold and extending upward from the manifold to the inside of the reaction tube; and (b) cleaning an inside of the process chamber, wherein the step (b) includes:

a first cleaning process of supplying a hydrogen fluoride gas into the reaction tube through the second nozzle; and a second cleaning process of supplying a hydrogen fluoride gas onto an inner wall surface of the manifold through a third nozzle disposed in the manifold.

(Supplementary Note 2)

In the cleaning method of Supplementary note 1, it is preferable that the first cleaning process and the second cleaning process are performed without supplying the hydrogen fluoride gas into the reaction tube through the first nozzle. That is, in the first cleaning process, the hydrogen fluoride gas is not supplied into the reaction tube through the first nozzle and the hydrogen fluoride gas is supplied into the reaction tube through the second nozzle. In the second cleaning process, the hydrogen fluoride gas is not supplied into the reaction tube through the first nozzle and the hydrogen fluoride gas is supplied toward the inner wall surface of the manifold through the third nozzle.

(Supplementary Note 3)

In the cleaning method of Supplementary note 1 or 2, it is preferable that the first cleaning process and the second cleaning process are performed with an inert gas being supplied into the reaction tube through the first nozzle.

(Supplementary Note 4)

In the cleaning method of any of Supplementary notes 1 to 3, it is preferable that a concentration of the hydrogen fluoride gas supplied through the third nozzle in the second cleaning process (a concentration of the hydrogen fluoride gas in the third nozzle) is higher than that of the hydrogen fluoride gas supplied through the second nozzle in the first cleaning process (a concentration of the hydrogen fluoride gas in the second nozzle).

(Supplementary Note 5)

In the cleaning method of any of Supplementary notes 1 to 4, it is preferable that the first cleaning process and the second cleaning process are non-simultaneously performed (asynchronously performed).

(Supplementary Note 6)

In the cleaning method of any of Supplementary notes 1 to 5, it is preferable that the first cleaning process and the second cleaning process are alternately performed.

(Supplementary Note 7)

In the cleaning method of any of Supplementary notes 1 to 8, it is preferable that the first cleaning process and the second cleaning process are alternately repeated.

(Supplementary Note 8)

In the cleaning method of any of Supplementary notes 5 to 7, it is preferable that the second cleaning process is performed with an inert gas being supplied into the reaction tube through the second nozzle.

(Supplementary Note 9)

In the cleaning method of any of Supplementary notes 5 to 8, it is preferable that the second cleaning process is performed with an inert gas being supplied into the reaction tube through the first nozzle and the second nozzle.

(Supplementary Note 10)

In the cleaning method of Supplementary note 8 or 9, it is preferable that the hydrogen fluoride gas supplied onto the inner wall surface of the manifold through the third nozzle is pushed downward by the inert gas supplied into the reaction tube in the second cleaning process.

(Supplementary Note 11)

In the cleaning method of any of Supplementary notes 8 to 9, it is preferable that the hydrogen fluoride gas supplied onto the inner wall surface of the manifold through the third nozzle is prevented (blocked) from flowing and diffusing into an upper portion in the reaction tube (an upper portion within the reaction tube) by the inert gas supplied into the reaction tube in the second cleaning process.

(Supplementary Note 12)

In the cleaning method of any of Supplementary notes 1 to 4, it is preferable that the first cleaning process and the second cleaning process are simultaneously performed.

(Supplementary Note 13)

In the cleaning method of any of Supplementary notes 1 to 12, it is preferable that at least one of the first cleaning process and the second cleaning process is intermittently performed.

(Supplementary Note 14)

In the cleaning method of any of Supplementary notes 1 to 13, it is preferable that a reducing gas is further supplied to the substrate in the process chamber under sub-atmospheric pressure through the first nozzle when supplying the oxidizing gas in the cycle.

(Supplementary Note 15)

In the cleaning method of any of Supplementary notes 1 to 14, it is preferable that a layer is formed on the substrate in the process chamber by supplying the source gas to the substrate in the process chamber through the first nozzle when supplying the source gas in the cycle, and the layer is oxidized and modified to an oxide layer by supplying the oxidizing gas to the substrate in the process chamber through the second nozzle and supplying a reducing gas through the first nozzle under sub-atmospheric pressure when supplying the oxidizing gas in the cycle.

(Supplementary Note 16)

According to another embodiment of the present invention, there are provided a method of manufacturing a semiconductor device, including:

(a) forming an oxide film on a substrate in the process chamber formed by a reaction tube and a manifold supporting the reaction tube by performing a cycle a predetermined number of times, the cycle including supplying a source gas to the substrate in the process chamber through a first nozzle disposed in the manifold and extending upward from the manifold to an inside of the reaction tube, and supplying an oxidizing gas to the substrate in the process chamber through a second nozzle disposed in the manifold and extending upward from the manifold to the inside of the reaction tube; and (b) cleaning an inside of the process chamber after the step (a) is performed, wherein the step (b) includes:

a first cleaning process of supplying a hydrogen fluoride gas into the reaction tube through the second nozzle; and a second cleaning process of supplying a hydrogen fluoride gas onto an inner wall surface of the manifold through a third nozzle disposed in the manifold.

(Supplementary Note 17)

According to still another embodiment of the present invention, there is provided a substrate processing apparatus, including:

a process chamber formed by a reaction tube and a manifold supporting the reaction tube;

a source gas supply system configured to supply a source gas into the process chamber;

an oxidizing gas supply system configured to supply an oxidizing gas into the process chamber;

a hydrogen fluoride gas supply system configured to supply a hydrogen fluoride gas into the process chamber;

a first nozzle disposed in the manifold and extending upward from the manifold to an inside of the reaction tube;

a second nozzle disposed in the manifold and extending upward from the manifold to the inside of the reaction tube;

a third nozzle disposed in the manifold; and a control unit configured to control the source gas supply system, the oxidizing gas supply system and the hydrogen fluoride gas supply system to perform: (a) forming an oxide film on a substrate in the process chamber by performing a cycle a predetermined number of times, the cycle including supplying the source gas to the substrate in the process chamber through the first nozzle and supplying the oxidizing gas to the substrate in the process chamber through the second nozzle; and (b) cleaning an inside of the process chamber after performing the step (a), wherein the step (b) includes a first cleaning process of supplying the hydrogen fluoride gas into the reaction tube through the second nozzle and a second cleaning process of supplying the hydrogen fluoride gas onto an inner wall surface of the manifold through the third nozzle.

(Supplementary Note 18)

According to yet another embodiment of the present invention, there are provided a program and a non-transitory computer-readable recording medium storing the program causing a computer to execute:

(a) forming an oxide film on a substrate in the process chamber formed by a reaction tube and a manifold supporting the reaction tube by performing a cycle a predetermined number of times, the cycle including supplying a source gas to the substrate in the process chamber through a first nozzle disposed in the manifold and extending upward from the manifold to an inside of the reaction tube, and supplying an oxidizing gas to the substrate in the process chamber through a second nozzle disposed in the manifold and extending upward from the manifold to the inside of the reaction tube; and (b) cleaning an inside of the process chamber after the step (a) is performed, wherein the step (b) includes:

a first cleaning process of supplying a hydrogen fluoride gas into the reaction tube through the second nozzle; and a second cleaning process of supplying a hydrogen fluoride gas onto an inner wall surface of the manifold through a third nozzle disposed in the manifold.

What is claimed is:

1. A substrate processing apparatus comprising:
a reaction tube configured to accommodate a substrate therein;
a manifold supporting the reaction tube;
a process chamber defined by the reaction tube and the manifold;
a cover portion configured to close an opening at a lower end of the manifold and face an entirety of an inner wall surface of the manifold in a circumferential direction of the inner wall surface;
a guide portion disposed at the cover portion to face the inner wall surface of the manifold;
a source gas supply system configured to supply a source gas into the process chamber via a first nozzle;
a reaction gas supply system configured to supply a reaction gas into the process chamber via a second nozzle; and
a third nozzle disposed at the manifold to supply a cleaning gas into a gap between the manifold and the guide portion,
wherein the guide portion has a clearance between an entirety of an upper end of the guide portion and the inner wall surface of the manifold.

2. The substrate processing apparatus of claim 1, wherein a gas supply hole of the third nozzle is lower than the upper end of the guide portion.

3. The substrate processing apparatus of claim 2, wherein the guide portion is disposed concentrically with the inner wall surface of the manifold.

4. The substrate processing apparatus of claim 3, wherein the guide portion comprises: a side surface portion facing the inner wall surface of the manifold; and an extending portion extending horizontally from the side surface portion toward the inner wall surface of the manifold.

5. The substrate processing apparatus of claim 4, wherein the extending portion comprises a slit.

6. The substrate processing apparatus of claim 5, wherein the extending portion extends from an upper end or a lower end of the side surface portion.

7. The substrate processing apparatus of claim 6, wherein the guide portion comprises a heat-resistant material including at least one of quartz and SiC.

8. The substrate processing apparatus of claim 7, wherein the reaction gas comprises an oxidizing gas.

9. The substrate processing apparatus of claim 8, wherein the cleaning gas comprises a hydrogen fluoride gas.

10. A guide portion of a substrate processing apparatus comprising: a reaction tube configured to accommodate a substrate therein; a manifold supporting the reaction tube; a process chamber defined by the reaction tube and the manifold; a source gas supply system configured to supply a source gas into the process chamber via a first nozzle; a reaction gas supply system configured to supply a reaction gas into the process chamber via a second nozzle; a cleaning gas supply system configured to supply a cleaning gas to the manifold via a third nozzle disposed at the manifold; and a cover portion configured to close an opening at a lower end of the manifold and face an entirety of an inner wall surface of the manifold in a circumferential direction of the inner wall surface, the guide portion, disposed at the cover portion, comprising:
a side surface portion facing the inner wall surface of the manifold to define a space with the manifold where the cleaning gas is supplied; and
an extending portion extending from the side surface portion toward the inner wall surface of the manifold,
wherein the guide portion has a clearance between an entirety of an upper end of the guide portion and the inner wall surface of the manifold.

11. The substrate processing apparatus of claim 1, wherein the clearance is configured t allow the cleaning gas supplied into the gap to escape from the gap to the process chamber therethrough.

* * * * *